US008463267B2

(12) United States Patent
You et al.

(10) Patent No.: US 8,463,267 B2
(45) Date of Patent: Jun. 11, 2013

(54) MOBILE TERMINAL AND METHOD OF SELECTING BROADCAST SERVICE PROVIDER THEREIN

(75) Inventors: Soo Lim You, Gyeonggi-do (KR); Beom Seok Cho, Seoul (KR)

(73) Assignee: LG Electronics Inc., Seoul (KR)

( * ) Notice: Subject to any disclaimer, the term of this patent is extended or adjusted under 35 U.S.C. 154(b) by 957 days.

(21) Appl. No.: 12/362,356

(22) Filed: Jan. 29, 2009

(65) Prior Publication Data

US 2009/0280808 A1 Nov. 12, 2009

(30) Foreign Application Priority Data

May 8, 2008 (KR) ........................ 10-2008-0042834

(51) Int. Cl.
*H04W 4/00* (2009.01)
(52) U.S. Cl.
USPC ............... 455/435.2; 455/550; 455/456.2; 455/3.06; 455/3.01

(58) Field of Classification Search
USPC .............................. 455/3.06, 3.01, 435.2, 550
See application file for complete search history.

(56) References Cited

U.S. PATENT DOCUMENTS

| 7,574,170 | B2 * | 8/2009 | Jendbro ...................... 455/3.06 |
| 2003/0032400 | A1 | 2/2003 | Tsubaki et al. |
| 2005/0024264 | A1 | 2/2005 | Harrison |
| 2006/0099962 | A1 * | 5/2006 | Lee ............................ 455/456.2 |
| 2006/0195239 | A1 * | 8/2006 | Teichner et al. ................ 701/36 |

FOREIGN PATENT DOCUMENTS

EP 1971141 9/2008

* cited by examiner

*Primary Examiner* — David Q Nguyen
(74) *Attorney, Agent, or Firm* — Lee, Hong, Degerman, Kang & Waimey

(57) ABSTRACT

A mobile terminal includes a wireless communication unit configured to search for at least one broadcast service provider based upon frequencies assigned to the at least one broadcast service provider and a controller configured to automatically select a first broadcast service provider from the at least one broadcast service provider and to output broadcast content provided by the selected first broadcast service provider.

24 Claims, 38 Drawing Sheets

FIG. 6A

| Syntax | Number of bits | Identifier |
|---|---|---|
| service_description_section(){ | | |
|     table_id | 8 | uimsbf |
|     section_syntax_indicator | 1 | bslbf |
|     reserved_future_use | 1 | bslbf |
|     reserved | 2 | bslbf |
|     section_length | 12 | uimsbf |
|     transport_stream_id | 16 | uimsbf |
|     reserved | 2 | bslbf |
|     version_number | 5 | uimsbf |
|     current_next_indicator | 1 | bslbf |
|     section_number | 8 | uimsbf |
|     last_section_number | 8 | uimsbf |
|     original_network_id | 16 | uimsbf |
|     reserved_future_use | 8 | bslbf |
|     for (i=0; i<N; i++){ | | |
|         serveice_id | 16 | uimsbf |
|         reserved_future_use | 6 | bslbf |
|         EIT_scedule_flag | 1 | bslbf |
|         EIT_present_following_flag | 1 | bslbf |
|         running_status | 3 | uimsbf |
|         free_CA_mode | 1 | bslbf |
|         descriptors_loop_length | 12 | uimsbf |
|         for (j=0; j<N; j++){ | | |
|             descrptor() | | |
|         } | | |
|     } | | |
|     CRC_32 | 32 | rpchof |
| } | | |

FIG. 6B

| Syntax | Number of bits | Identifier |
|---|---|---|
| linkage_descriptor() { | | |
|     descriptor_tag | 8 | uimsbf |
|     descriptor_length | 8 | uimsbf |
|     transport_stream_id | 16 | uimsbf |
|     original_network_id | 16 | uimsbf |
|     service_id | 16 | uimsbf |
|     linkage_type | 8 | uimsbf |
|     if (linkage_type == 0x0B) { | | |
|         platform_id_data_length | 8 | uimsbf |
|         for (i=0; i<N; i++) { | | |
|             platform_id | 24 | uimsbf |
|             platform_name_loop_length | 8 | uimsbf |
|             for (i=0; i<N; i++) { | | uimsbf |
|                 ISO_639_language_code | 24 | bslbf |
|                 platform_name_length | 8 | uimsbf |
|                     for (i=0; i<platform_name_length; i++) { | | |
|                         text_char | 8 | uimsbf |
|                   } | | |
|             } | | |
|         } | | |
|         for (i=0; i<N; i++) { | | |
|             private_data_byte | 8 | uimsbf |
|         } | | |
|     } | | |
| } | | |

FIG. 6C

| Syntax | Number of bits | Identifier |
|---|---|---|
| IP/MAC_notification_info() { | | |
|     platform_id_data_length | 8 | uimsbf |
|     for (i=0; i<N; i++) { | | |
|         platform_id | 24 | uimsbf |
|         action_type | 8 | uimsbf |
|         reserved | 2 | bslbf |
|         INT_versioning_flag | 1 | bslbf |
|         INT_version | 5 | uimsbf |
|         } | | |
|     } | | |
|     for (i=0; i<N; i++) { | | |
|         private_data_byte | 8 | uimsbf |
|     } | | |
| } | | |

FIG. 6D

| Syntax | Number of bits | Identifier | Remarks |
|---|---|---|---|
| IP/MAC_notification_section() { | | | |
|     table_id | 8 | uimsbf | 0x4C |
|     section_syntax_indicator | 1 | bslbf | 1b |
|     reserved_for_future_use | 1 | bslbf | 1b |
|     reserved | 2 | bslbf | 11b |
|     section_length | 12 | uimsbf | |
|     action_type | 8 | uimsbf | see table 14 |
|     platform_id_hash | 8 | uimsbf | |
|     reserved | 2 | bslbf | 11b |
|     version_number | 5 | uimsbf | |
|     current_next_indicator | 1 | bslbf | 1b |
|     section_number | 8 | uimsbf | |
|     last_section_number | 8 | uimsbf | |
|     platform_id | 24 | uimsbf | |
|     processing_order | 8 | uimsbf | 0x00 |
|     platform_descriptor_loop() | | | |
|     for(i=0, i<N1, i++) { | | | |
|         target_descriptor_loop() | | | |
|         operational_descriptor_loop() | | | |
|     } | | | |
|     CRC_32 | 32 | rpchof | |
| } | | | |

FIG. 6E

| Syntax | Number of bits | Identifier |
|---|---|---|
| network_information_section() { | | |
|    table_id | | |
|    section_syntax_indicator | 8 | uimsbf |
|    reserved_for_future_use | 1 | bslbf |
|    reserved | 1 | bslbf |
|    section_length | 2 | bslbf |
|    network_id | 12 | uimsbf |
|    reserved | 16 | uimsbf |
|    version_number | 2 | bslbf |
|    current_next_indicator | 5 | uimsbf |
|    section_number | 1 | bslbf |
|    last_section_number | 8 | uimsbf |
|    reserved_future_use | 8 | uimsbf |
|    network_descriptors_length | 4 | bslbf |
|    for(i=0; i<N; i++) { | 12 | uimsbf |
|       descriptor() | | |
|    } | | |
|    reserved_future_use | 4 | bslbf |
|    transport_stream_loop_length | 12 | uimsbf |
|    for (i; i<N; i++) { | | |
|       transport_stream_id | 16 | uimsbf |
|       original_network_id | 16 | uimsbf |
|       reserved_future_use | 4 | bslbf |
|       transport_descriptors_length | 12 | uimsbf |
|       for(j=0; j<N; j++) { | | |
|          descriptor() | | |
|       } | | |
|    } | | |
|    CRC_32 | 32 | rpchof |
| } | | |

(a)

(b)

(a)

(b)

MOBILE TERMINAL AND METHOD OF SELECTING BROADCAST SERVICE PROVIDER THEREIN

CROSS-REFERENCE TO RELATED APPLICATIONS

Pursuant to 35 U.S.C. §119(a), this application claims the benefit of earlier filing date and right of priority to Korean Application No. 10-2008-0042834, filed on May 8, 2008, the contents of which are hereby incorporated by reference herein in their entirety.

FIELD OF THE INVENTION

The present invention relates to a mobile terminal and a method of selecting a broadcast service provider therein. While the present invention is suitable for a wide scope of applications, it is particularly suitable for a mobile terminal having a broadcast receiving function.

DISCUSSION OF THE RELATED ART

A mobile terminal is a device which may be configured to perform various functions. Examples of such functions include data and voice communications, capturing images and video via a camera, recording audio, playing music files via a speaker system, and displaying images and video on a display. Some mobile terminals include additional functionality which supports game playing, while other mobile terminals are configured as multimedia players. More recently, mobile terminals have been configured to receive broadcast and multicast signals which permit viewing of contents such as videos and television programs.

Efforts are ongoing to support and increase the functionality of mobile terminals. Such efforts include software and hardware improvements, as well as changes and improvements in the structural components which form the mobile terminal.

In a mobile terminal receiving broadcasting content according to a related art, a user selects a specific broadcast service provider from a broadcast service provider list including a plurality of broadcast service providers and a broadcasting program corresponding to the selected broadcast service provider is output. Hence, the mobile terminal is capable of receiving broadcast service and functions to receive and output broadcast relevant data of the broadcasting program corresponding to the selected broadcast service provider. However, according to the related art, it is inconvenient for a user to select a specific broadcast service provider from the broadcast service provider list because the user must browse each broadcast service provider one by one from the broadcast service provider list.

Further, according to the related art mobile terminal capable of receiving broadcast service, if a user attempts to select another broadcast service provider while a broadcast signal corresponding to the currently selected broadcast service provider is being output, the user needs to select a specific broadcast service provider by selecting a broadcast service provider change menu item via a menu search. Therefore, if the user wants to select another broadcast service provider while a broadcast signal is being output, it is inconvenient for the user to perform the menu search.

SUMMARY OF THE INVENTION

In accordance with an embodiment, a mobile terminal includes a wireless communication unit configured to search for at least one broadcast service provider based upon frequencies assigned to the at least one broadcast service provider and a controller configured to automatically select a first broadcast service provider from the at least one broadcast service provider and to output broadcast content provided by the selected first broadcast service provider. In one aspect, the first broadcast service provider is the only available broadcast service provider of a plurality of broadcast service providers.

In one aspect, the first broadcast service provider includes a designated specific broadcast service provider. Preferably, the controller is further configured to automatically select the designated specific broadcast service provider responsive to detecting the designated specific broadcast service provider during the search, wherein the designated broadcast service provide is automatically selected before the search is completed.

In one aspect, the wireless communication unit is further configured to continue to search for the at least one broadcast service provider after the first broadcast service provider is automatically selected. Further, the controller may be further configured to automatically select the first broadcast service provider, which is not a designated specific broadcast service provider, whenever any received signaling associated with the designated specific broadcast service provider falls below a threshold.

The wireless communication unit may be further configured to continue searching for the designated broadcast service provider after the first broadcast service provider is selected, determine that broadcast content provided by the designated broadcast service provider is available to be received by the mobile terminal, and switch from the first broadcast service provider to the designated broadcast service provider responsive to the determining that the designated broadcast service provider is available.

In one aspect, the mobile terminal further includes a display unit configured to display a broadcast service provider list comprising at least one available broadcast service provider. In one aspect, the broadcast service provider list is categorized into defined groups, each of the defined groups comprising a broadcast service provider satisfying a condition. Preferably, each of the defined groups includes at least one provider selected from the group consisting of an available broadcast service provider, a previous/next broadcast service provider, a user preferred broadcast service provider, a user designated broadcast service provider, a mobile terminal designated broadcast service provider, a strong signaling broadcast service provider, or a similar broadcasting content-providing broadcast service provider.

In one aspect, the wireless communication unit is further configured to receive broadcast related data corresponding to the first broadcast service provider, and the mobile terminal further includes an output unit configured to output the received broadcast related data, the broadcast related data comprising at least one type of data selected from the group consisting of broadcast guide information and broadcast data.

In one aspect, the wireless communication unit is further configured to receive identification information for identifying each of the at least one broadcast service provider to permit the controller to identify at least one available broadcast service provider among the searched at least one broadcast service provider.

In one aspect, the mobile terminal further includes a display unit configured to display the broadcasting content corresponding to the first broadcast service provider, the display unit further comprising an area for receiving user input for selecting a second broadcast service provider, wherein the second broadcast service provider is one of the searched at least one broadcast service provider that is available.

In one aspect, the wireless communication unit is further configured to search for the at least one broadcast service provider when the broadcasting content provided by the selected first broadcast service provider falls below a threshold. In one aspect, the mobile terminal further includes a display configured to display a broadcast service provider list when the broadcasting content received from the first broadcast service provider remains below the threshold.

In accordance with an embodiment, a mobile terminal includes a wireless communication unit for searching for a first broadcast service provider based upon frequencies assigned to various broadcast service providers and a controller for selecting the first broadcast service provider from among the various broadcast service providers and outputting broadcast content provided by the selected first broadcast service provider.

In accordance with an embodiment, a method of selecting a broadcast service provider in a mobile terminal includes scanning frequencies assigned to broadcast service providers, searching for at least one available broadcast service provider according to a result of the scanning, selecting a first broadcast service provider from the at least one available broadcast service provider, and outputting broadcast content provided by the selected first broadcast service provider.

These and other embodiments will also become readily apparent to those skilled in the art from the following detailed description of the embodiments having reference to the attached figures, the invention not being limited to any particular embodiment disclosed.

BRIEF DESCRIPTION OF THE DRAWINGS

The above and other aspects, features, and advantages of the present invention will become more apparent upon consideration of the following description of preferred embodiments, taken in conjunction with the accompanying drawings.

FIGS. 6A to 6E are diagrams of a data structure containing identification information according to an embodiment of the present invention.

FIGS. 17A to 23B show a screen on which a key region for selecting a different broadcast service provider is displayed in a mobile terminal according to an embodiment of the present invention while a broadcast program corresponding to the currently selected broadcast service provider is being output.

DETAILED DESCRIPTION OF PREFERRED EMBODIMENTS

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

Figure 1:
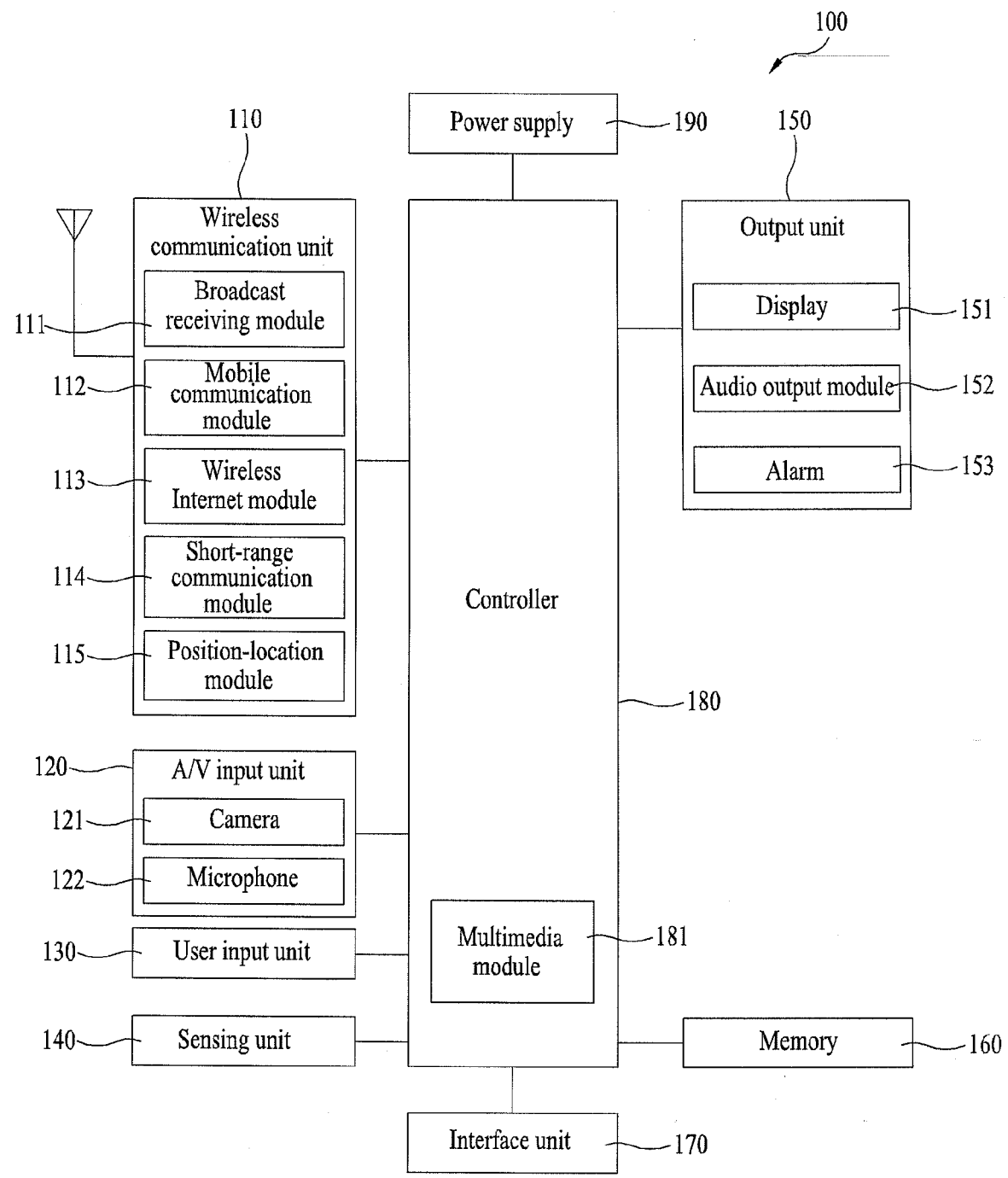
FIG. 1 is a block diagram of a mobile terminal according to an embodiment of the present invention.

FIG. 1 is a block diagram of mobile terminal 100 according to an embodiment of the present invention. The mobile terminal 100 may be implemented in a variety of different types, such as mobile phones, user equipment, smart phones, computers, digital broadcast mobile terminals, personal digital assistants, portable multimedia players (PMP) and navigators. By way of non-limiting example only, further description will be with regard to a mobile phone. However, such teachings apply equally to other types of mobile terminals. FIG. 1 shows the mobile terminal 100 having various components, but it is understood that implementing all of the illustrated components is not a requirement. Greater or fewer components may alternatively be implemented.

FIG. 1 shows a wireless communication unit 110 configured with several commonly implemented components. For example, the wireless communication unit 110 typically includes one or more components which permit wireless communication between the mobile terminal 100 and a wireless communication system or network within which the mobile terminal is located.

The broadcast receiving module 111 receives a broadcast signal and/or broadcast associated information from an external broadcast managing entity via a broadcast channel. The broadcast channel may include a satellite channel and a terrestrial channel. The broadcast managing entity refers generally to a system which transmits a broadcast signal and/or broadcast associated information. Examples of broadcast associated information include information associated with a broadcast channel, a broadcast program, and a broadcast service provider. For example, broadcast associated information may include an electronic program guide (EPG) of digital multimedia broadcasting (DMB) and electronic service guide (ESG) of digital video broadcast-handheld (DVB-H).

The broadcast signal may be implemented as a TV broadcast signal, a radio broadcast signal, and a data broadcast signal, among others. If desired, the broadcast signal may further include a broadcast signal combined with a TV or radio broadcast signal.

The broadcast receiving module 111 may be configured to receive broadcast signals transmitted from various types of broadcast systems. By nonlimiting example, such broadcasting systems include digital multimedia broadcasting-terrestrial (DMB-T), digital multimedia broadcasting-satellite (DMB-S), digital video broadcast-handheld (DVB-H), the data broadcasting system known as media forward link only (MediaFLO®) and integrated services digital broadcast-terrestrial (ISDB-T). Receiving multicast signals is also possible. If desired, data received by the broadcast receiving module 111 may be stored in a suitable device, such as memory 160.

The mobile communication module 112 transmits/receives wireless signals to/from one or more network entities, such as a base station and Node-B. Such signals may represent audio, video, multimedia, control signaling, and data, among others.

The wireless Internet module 113 supports Internet access for the mobile terminal 100. This module may be internally or externally coupled to the mobile terminal 100.

The short-range communication module 114 facilitates relatively short-range communications. Suitable technologies for implementing this module include radio frequency identification (RFID), infrared data association (IrDA), ultra-wideband (UWB), as well at the networking technologies commonly referred to as Bluetooth and ZigBee, to name a few.

Position-location module 115 identifies or otherwise obtains the location of the mobile terminal 100. If desired, this module may be implemented using global positioning system (GPS) components which cooperate with associated satellites, network components, and combinations thereof.

Audio/video (A/V) input unit 120 is configured to provide audio or video signal input to the mobile terminal 100. As shown, the A/V input unit 120 includes a camera 121 and a microphone 122. The camera 121 receives and processes image frames of still pictures or video.

The microphone 122 receives an external audio signal while the mobile terminal 100 is in a particular mode, such as phone call mode, recording mode and voice recognition. This audio signal is processed and converted into digital data. The mobile terminal 100 and in particular, A/V input unit 120, typically includes assorted noise removing algorithms to remove noise generated in the course of receiving the external audio signal. Data generated by the A/V input unit 120 may be stored in memory 160, utilized by output unit 150, or transmitted via one or more modules of the communication unit 110. If desired, two or more microphones 122 and/or cameras 121 may be used.

The user input unit 130 generates input data responsive to user manipulation of an associated input device or devices. Examples of such devices include a keypad, a dome switch, a jog wheel, a jog switch, and a touchpad, such as a static pressure touchpad and capacitance touchpad. A specific example is one in which the user input unit 130 is configured as a touchpad in cooperation with a touchscreen display which will be described in more detail below.

The sensing unit 140 provides status measurements of various aspects of the mobile terminal 100. For example, the sensing unit 140 may detect an open/close status of the mobile terminal 100, relative positioning of components, such as a display and a keypad of the mobile terminal, a change of position of the mobile terminal or a component of the mobile terminal, presence or absence of user contact with the mobile terminal, and orientation or acceleration/deceleration of the mobile terminal. For example, the mobile terminal 100 may be configured as a slide-type mobile terminal. In this configuration, the sensing unit 140 may sense whether a sliding portion of the mobile terminal 100 is open or closed. Other examples include the sensing unit 140 sensing the presence or absence of power provided by the power supply 190, the presence or absence of a coupling or other connection between the interface unit 170 and an external device.

The interface unit 170 is often implemented to couple the mobile terminal 100 with external devices. Typical external devices include wired/wireless headphones, external chargers, power supplies, earphones, microphones, and storage devices configured to store data, such as audio, video, and pictures, among others. The interface unit 170 may be configured using a wired/wireless data port, audio input/output ports, video input/output ports, and a card socket for coupling to a memory card and a device equipped with an identity module.

The identity module is a chip storing various kinds of information for identifying or authenticating use authority of the mobile terminal 100. The identity module may include one of a user identity module (UIM), a subscriber identity module (SIM), a universal subscriber identity module (USIM) and the like. In particular, the identity module may further include a module for identifying or authenticating authority for a broadcast purchase and/or a broadcast viewing using the mobile terminal 100. A device provided with the identity module, i.e., an identity device can be manufactured as a smart card. Hence, the identity device can be connected to the mobile terminal 100 via a port for connecting the identity device.

The output unit 150 generally includes various components which support the output requirements of the mobile terminal 100. Display 151 is typically implemented to visually display information associated with the mobile terminal 100. For example, if the mobile terminal 100 is operating in a phone call mode, the display 151 generally provides a user interface or graphical user interface which includes information associated with placing, conducting, and terminating a phone call. As another example, if the mobile terminal 100 is in a video call mode or a photographing mode, the display 151 may additionally or alternatively display images which are associated with these modes.

One particular implementation includes the display 151 configured as a touch screen working in cooperation with an input device, such as a touchpad. This configuration permits the display 151 to function both as an output device and an input device.

The display 151 may be implemented using known display technologies including, for example, a liquid crystal display (LCD), a thin film transistor-liquid crystal display (TFT-LCD), an organic light-emitting diode display (OLED), a flexible display and a three-dimensional display. The mobile terminal 100 may include one or more of such displays. An example of a two-display embodiment is one in which one display is configured as an internal display, which is viewable when the mobile terminal 100 is in an opened position, and a second display configured as an external display, which is viewable in both the open and closed positions.

Meanwhile, a proximity sensor may be provided within the touchscreen or around the touchscreen. Alternatively, the proximity sensor can be provided within the sensing unit 140.

The proximity sensor is a sensor that detects presence or absence of an object approaching a prescribed detecting surface or an object existing around the proximity sensor using an electromagnetic field strength or infrared ray without direct contact. Hence, the proximity sensor has durability longer than that of a contact type sensor and also has wider utilities than those of the contact type sensor. The proximity sensor may include one of a transmittive photoelectric sensor, a direct reflective photoelectric sensor, a mirror reflective photoelectric sensor, a radio frequency oscillation proximity sensor, an electrostatic capacity proximity sensor, a magnetic proximity sensor, an infrared proximity sensor and the like.

One example for the operational principle of the radio frequency oscillation proximity sensor is explained as follows. First of all, while an oscillation circuit is oscillating a full-wave radio frequency, if an object approaches in the vicinity of the sensor detecting surface, oscillation amplitude of the oscillation circuit attenuates or stops. And, such a variation is converted to an electric signal to detect presence or absence of the object. Therefore, even if a different substance except a metallic substance is placed between the radio frequency oscillation proximity sensor and the object, the proximity switch is able to detect a specific object without interference with the different substance.

Even if the proximity sensor is not provided, in case that the touchscreen is an electrostatic type, the proximity sensor can be configured to detect proximity of a pointer using a variation of an electric field according to the proximity of the pointer. Therefore, if the pointer is located in the vicinity of the touchscreen while not directly contacting the touchscreen, it is able to detect the position of the pointer and the distance between the pointer and the touchscreen.

In the following description, for clarity, an action that a pointer approaches without directly contacting the touchscreen to be recognized as located on the touchscreen is named 'proximity touch'. And, an action that a pointer actually touches the touchscreen is named 'contact touch'. The position on the touchscreen proximity-touched by the pointer is where the pointer points vertically toward the touchscreen when the pointer performs the proximity touch.

The proximity sensor detects a proximity touch action and a proximity touch pattern, such as a proximity touch distance, a proximity touch duration, a proximity touch position, and a proximity touch shift state. Information corresponding to the detected proximity touch action and the detected proximity touch pattern can be output to the touchscreen.

FIG. 1 further shows output unit 150 having an audio output module 152 which supports the audio output requirements of the mobile terminal 100. The audio output module 152 is often implemented using one or more speakers, buzzers, other audio producing devices, and combinations thereof. The audio output module 152 functions in various modes including a call-receiving mode, a call-placing mode, a recording mode, a voice recognition mode and a broadcast reception mode. During operation, the audio output module 152 outputs audio relating to a particular function, such as call received, message received, and errors.

The output unit 150 further includes an alarm 153, which is commonly used to signal or otherwise identify the occurrence of a particular event associated with the mobile terminal 100. Typical events include call received, message received and user input received. An example of such output includes providing tactile sensations, such as vibration, to a user. For example, the alarm 153 may be configured to vibrate responsive to the mobile terminal 100 receiving a call or message. As another example, vibration is provided by alarm 153 responsive to user input to the mobile terminal 100, thus providing a tactile feedback mechanism. It is understood that the various output provided by the components of output unit 150 may be separately performed, or such output may be performed using any combination of such components.

The memory 160 is generally used to store various types of data to support the processing, control, and storage requirements of the mobile terminal 100. Examples of such data include program instructions for applications operating on the mobile terminal 100, contact data, phonebook data, messages, pictures, video, and the like. The memory 160 shown in FIG. 1 may be implemented using any type or combination of suitable volatile and non-volatile memory or storage devices including random access memory (RAM), static random access memory (SRAM), electrically erasable programmable read-only memory (EEPROM), erasable programmable read-only memory (EPROM), programmable read-only memory (PROM), read-only memory (ROM), magnetic memory, flash memory, magnetic or optical disk, card-type memory, or other similar memory or data storage device.

The controller 180 typically controls the overall operations of the mobile terminal 100. For example, the controller 180 performs the control and processing associated with voice calls, data communications, video calls, camera operations and recording operations. If desired, the controller 180 may include a multimedia module 181 which provides a multimedia playback function. The multimedia module 181 may be configured as part of the controller 180, or this module may be implemented as a separate component.

Further, the controller 180 may also perform pattern recognizing processing for recognizing a handwriting input received on the touchscreen as a character or recognizing a picture drawing input received on the touchscreen as an image.

The power supply 190 provides power required by the various components for the mobile terminal 100. The provided power may be internal power, external power, or combinations thereof.

Various embodiments described herein may be implemented in a computer-readable medium using, for example, computer software, hardware, or some combination thereof. For a hardware implementation, the embodiments described herein may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a selective combination thereof. In some cases, such embodiments are implemented by controller 180.

For a software implementation, the embodiments described herein may be implemented with separate software modules, such as procedures and functions, each of which perform one or more of the functions and operations described herein. The software codes can be implemented with a software application written in any suitable programming language and may be stored in memory 160 and executed by a controller 180 or processor.

The mobile terminal 100 may be implemented in a variety of different configurations. Examples of such configurations include folder-type, slide-type, bar-type, rotational-type, swing-type and combinations thereof. For clarity, further disclosure will primarily relate to a slide-type mobile terminal. However, such teachings apply equally to other types of mobile terminals.

Figure 2A:
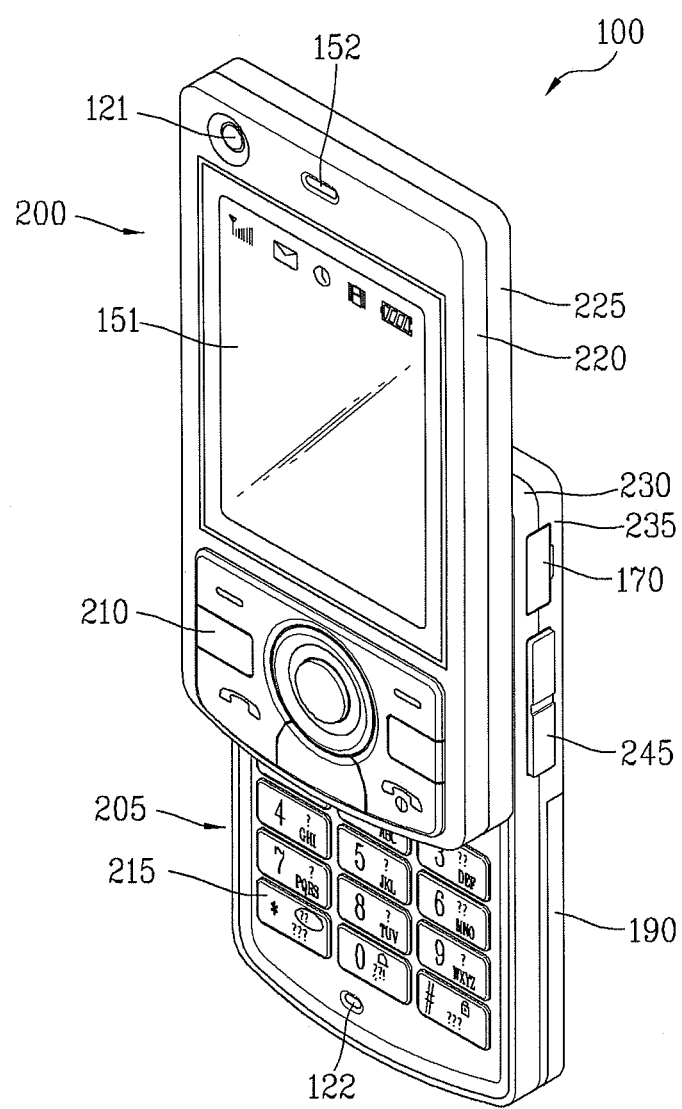
FIG. 2A is a perspective view of a front side of a mobile terminal according to an embodiment of the present invention.

FIG. 2A is a perspective view of a front side of a mobile terminal according to an embodiment of the present invention. In FIG. 2A, the mobile terminal 100 has a first body 200 configured to slideably cooperate with a second body 205. The user input unit described in FIG. 1 is implemented using function keys 210 and keypad 215. The function keys 210 are associated with the first body 200, and the keypad 215 is associated with the second body 205. The keypad 215 includes various keys, such as numbers, characters, and symbols, to enable a user to place a call, prepare a text or multimedia message, and otherwise operate the mobile terminal 100.

The first body 200 slides relative to the second body 205 between open and closed positions. In a closed position, the first body 200 is positioned over the second body 205 in such a manner that the keypad 215 is substantially or completely covered by the first body 200. In the open position, user access to the keypad 215, as well as the display 151 and function keys 210, is possible. The function keys are convenient to a user for entering commands such as start, stop and scroll.

The mobile terminal 100 is operable in either a standby mode, in which capable of receiving a call or message, receiving and responding to network control signaling, or an active call mode. Typically, the mobile terminal 100 functions in the standby mode in the closed position, and the active call mode in the open position. This mode configuration may be changed as required or desired.

The first body 200 is formed from a first case 220 and a second case 225, and the second body 205 is formed from a first case 230 and a second case 235. The first 220, 230 and second cases 225, 235 are usually formed from a suitably ridge material such as injection molded plastic, or formed using metallic material such as stainless steel (STS) and titanium (Ti).

If desired, one or more intermediate cases may be provided between the first 220, 230 and second cases 225, 235 of one or both of the first and second bodies 200, 205. The first and second bodies 200, 205 are typically sized to receive electronic components necessary to support operation of the mobile terminal 100.

The first body 200 is shown having a camera 121 and audio output unit 152, which is configured as a speaker, positioned relative to the display 151. If desired, the camera 121 may be constructed in such a manner that it can be selectively positioned such that rotated and swiveled relative to first body 200.

The function keys 210 are positioned adjacent to a lower side of the display 151. The display 151 is implemented as an LCD or OLED. Recall that the display 151 may also be configured as a touchscreen having an underlying touchpad which generates signals responsive to user contact, for example, via a finger or stylus, with the touchscreen.

Second body 205 has a microphone 122 positioned adjacent to the keypad 215, and side keys 245, which are one type of a user input unit 130, positioned along the side of second body 205. Preferably, the side keys 245 may be configured as hot keys, such that the side keys are associated with a particular function of the mobile terminal 100. An interface unit 170 is positioned adjacent to the side keys 245, and a power supply 190 in a form of a battery is located on a lower portion of the second body 205.

Figure 2B:
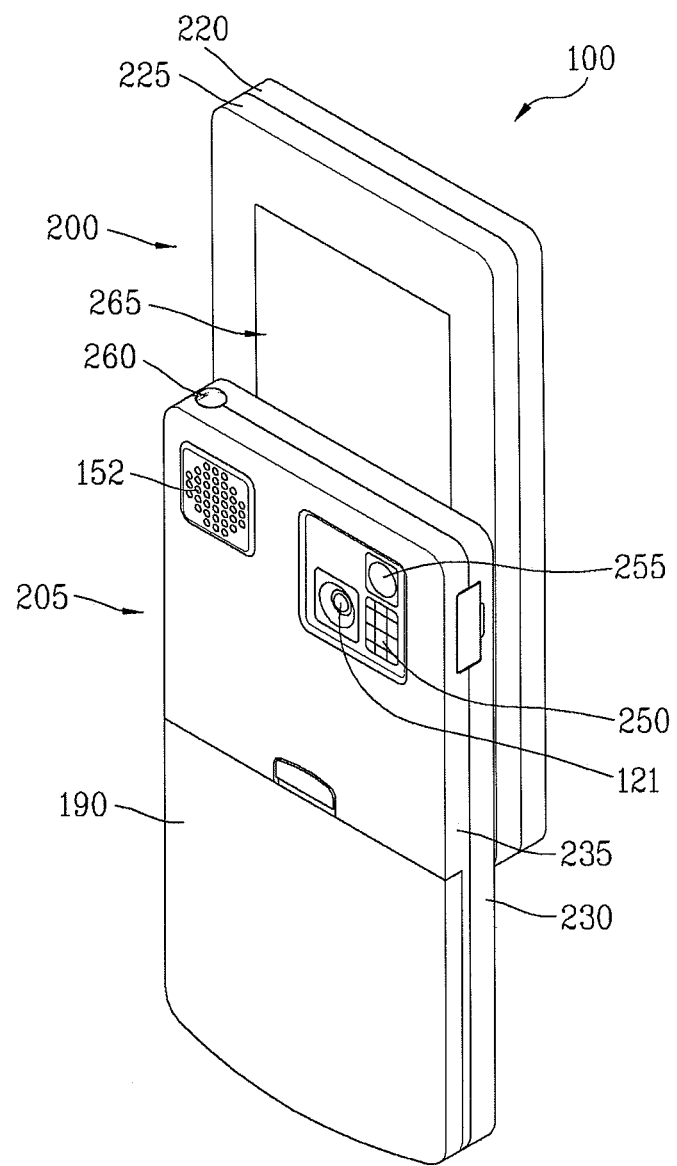
FIG. 2B is a rear view of the mobile terminal shown in FIG. 2A.

FIG. 2B is a rear view of the mobile terminal 100 shown in FIG. 2A. FIG. 2B shows the second body 205 having a camera 121 and an associated flash 250 and mirror 255. The flash 250 operates in conjunction with the camera 121 of the second body 205. The mirror 255 is useful for assisting a user to position the camera 121 in a self-portrait mode. The camera 121 of the second body 205 faces a direction which is opposite to a direction faced by camera 121 of the first body 200 (FIG. 2A). Each of the cameras 121 of the first and second bodies 200, 205 may have the same or different capabilities.

In an embodiment, the camera 121 of the first body 200 operates with a relatively lower resolution than the camera 121 of the second body 205. Such an arrangement works well during a video conference, for example, in which reverse link bandwidth capabilities may be limited. The relatively higher resolution of the camera 121 of the second body 205 (FIG. 2B) is useful for obtaining higher quality pictures for later use or for communicating to others.

The second body 205 also includes an audio output module 152 configured as a speaker, and which is located on an upper side of the second body. If desired, the audio output modules 152 of the first and second bodies 200, 205 may cooperate to provide stereo output. Moreover, either or both of these audio output modules 152 may be configured to operate as a speakerphone.

A broadcast signal receiving antenna 260 is located at an upper end of the second body 205. Antenna 260 functions in cooperation with the broadcast receiving module 111 (FIG. 1). If desired, the antenna 260 may be fixed or configured to retract into the second body 205. The rear side of the first body 200 includes slide module 265, which slideably couples with a corresponding slide module located on the front side of the second body 205.

It is understood that the illustrated arrangement of the various components of the first and second bodies 200, 205 may be modified as required or desired. In general, some or all of the components of one body may alternatively be implemented on the other body. In addition, the location and relative positioning of such components are not critical to many embodiments, and as such, the components may be positioned at locations which differ from those shown by the representative figures.

Figure 3A:
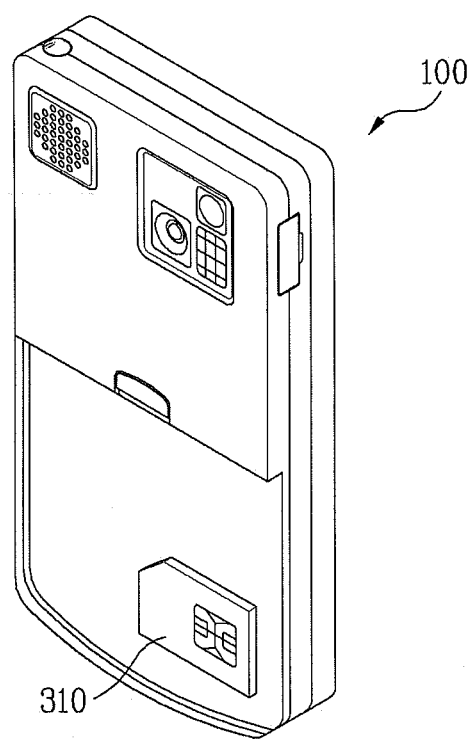
FIG. 3A and FIG. 3B show a mobile terminal according to an embodiment of the present invention in which an identity device is attached or detached.
Figure 3B:
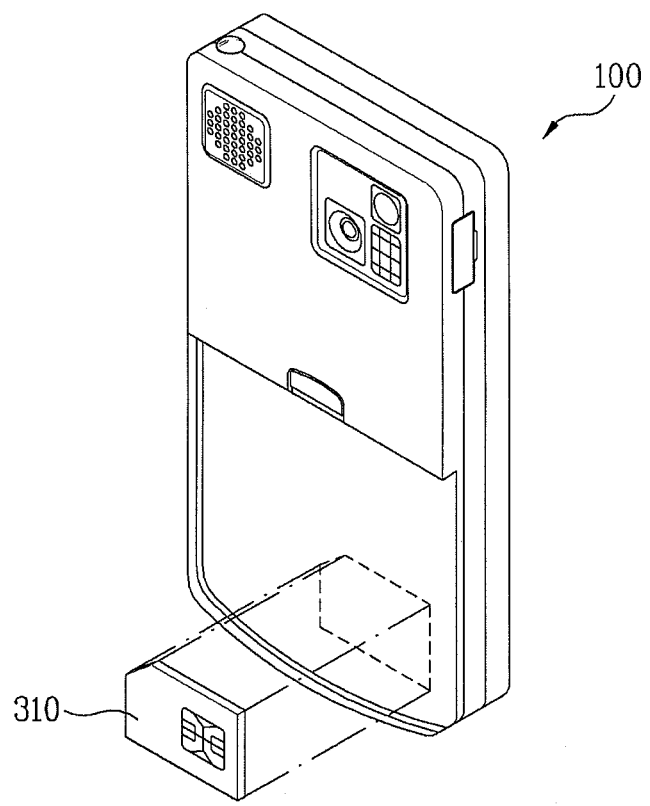

FIG. 3A and FIG. 3B show an identity device that is attached to or detached from a mobile terminal 100 according to an embodiment of the present invention. For example, the identity device includes the SIM card.

Referring to FIG. 3A and FIG. 3B, the identity device 310 is detachably provided to the mobile terminal 100. Hence, a new identity device can be loaded into the mobile terminal 100 by replacing an old identity device.

Optionally, the identity device 310 can be loaded in the mobile terminal 100 by being combined with the interface unit 170. Alternatively, the identity device 310 can be provided to the mobile terminal 100 by being connected to a connector separately provided for connection with the identity device. A connecting element for connecting the identity device 310 and the mobile terminal 100 together can be provided to any one of the backside, lateral sides, and front side of the mobile terminal.

The mobile terminal 100 shown in FIGS. 1 to 3B can be configured to be operable in a wire/wireless communication system, a satellite based communication system or a communication system capable of transmitting data carried on frames or packets. Further, the mobile terminal 100 of FIGS. 1-3B may be configured to operate within a communication system which transmits data via frames or packets, including both wireless and wireline communication systems, and satellite-based communication systems. Such communication systems utilize different air interfaces and/or physical layers.

Examples of such air interfaces utilized by the communication systems include, for example, frequency division multiple access (FDMA), time division multiple access (TDMA), code division multiple access (CDMA), and universal mobile telecommunications system (UMTS), the long term evolution (LTE) of the UMTS, and the global system for mobile communications (GSM). By way of non-limiting example only, further description will relate to a CDMA communication system, but such teachings apply equally to other system types.

Figure 4:
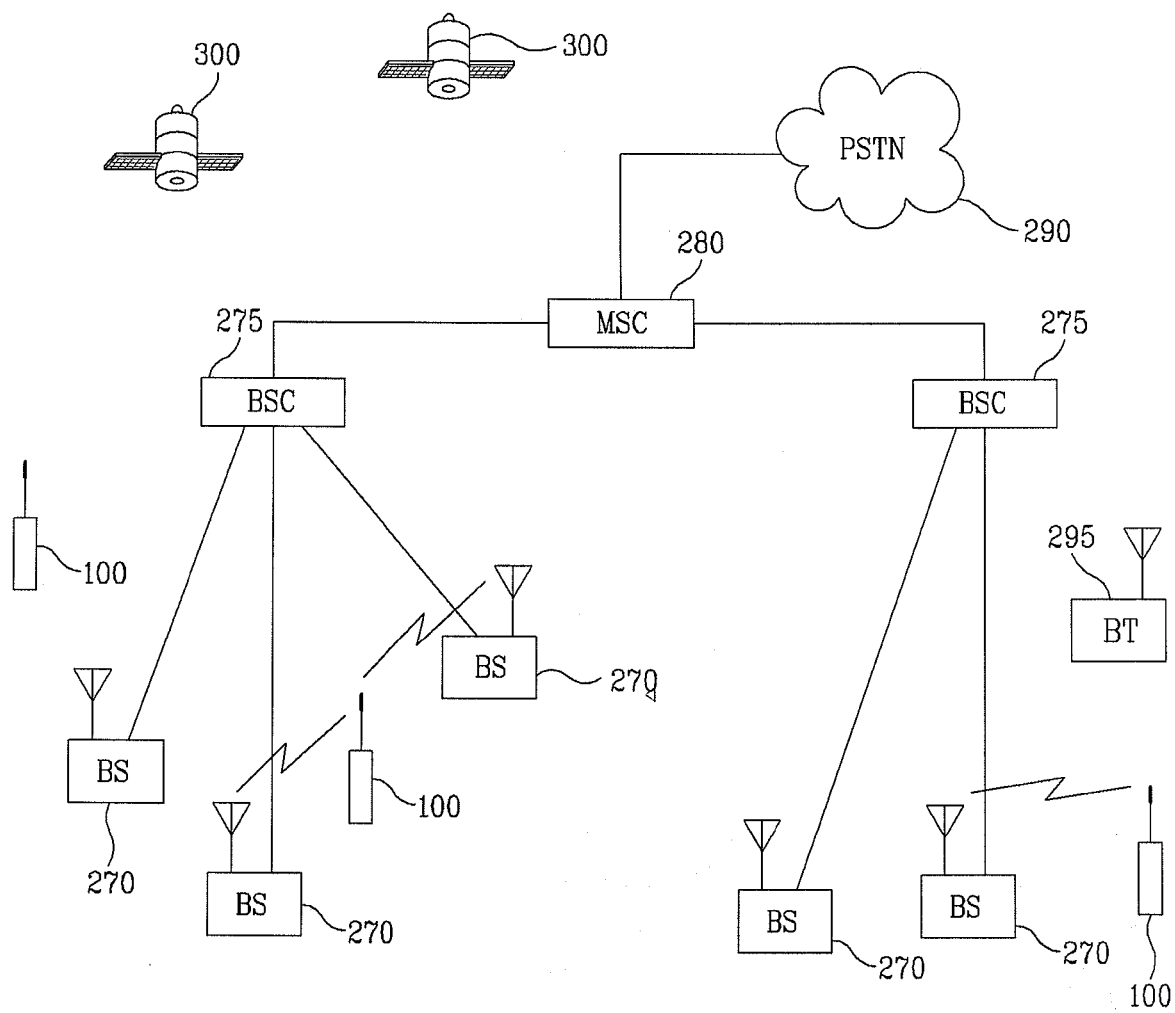
FIG. 4 is a block diagram of a CDMA wireless communication system operable with the mobile terminal of FIGS. 1-3B.

Referring now to FIG. 4, a CDMA wireless communication system is shown having a plurality of mobile terminals 100, a plurality of base stations 270, base station controllers (BSCs) 275, and a mobile switching center (MSC) 280. The MSC 280 is configured to interface with a conventional public switch telephone network (PSTN) 290. The MSC 280 is also configured to interface with the BSCs 275. The BSCs 275 are coupled to the base stations 270 via backhaul lines. The backhaul lines may be configured in accordance with any of several known interfaces including, for example, E1/T1, ATM, IP, PPP, Frame Relay, HDSL, ADSL, or xDSL. It is to be understood that the system may include more than two BSCs 275.

Each base station 270 may include one or more sectors, each sector having an omnidirectional antenna or an antenna pointed in a particular direction radially away from the base station 270. Alternatively, each sector may include two antennas for diversity reception. Each base station 270 may be configured to support a plurality of frequency assignments, with each frequency assignment having a particular spectrum, for example, 1.25 MHz or 5 MHz.

The intersection of a sector and frequency assignment may be referred to as a CDMA channel. The base stations 270 may also be referred to as base station transceiver subsystems (BTSs). In some cases, the term "base station" may be used to refer collectively to a BSC 275, and one or more base stations 270. The base stations 270 may also be denoted "cell sites." Alternatively, individual sectors of a given base station 270 may be referred to as cell sites.

A broadcasting transmitter (BT) 295 broadcasts to mobile terminals 100 operating within the system. The broadcast receiving module 111 (FIG. 1) of the mobile terminal 100 is typically configured to receive broadcast signals transmitted by the broadcasting transmitter 295. Similar arrangements may be implemented for other types of broadcast and multicast signaling as discussed above.

FIG. 4 further depicts several global positioning system (GPS) satellites 300. Such satellites facilitate locating the position of some or all of the mobile terminals 100. Two satellites 300 are depicted, but it is understood that useful positioning information may be obtained with greater or fewer satellites. The position-location module 115 of the mobile terminal 100 is typically configured to cooperate with the satellites 300 to obtain desired position information. It is to be appreciated that other types of position detection technology, i.e., a location technology that may be used in addition to or instead of GPS location technology, may alternatively be implemented. If desired, some or all of the GPS satellites 300 may alternatively or additionally be configured to provide satellite DMB transmissions.

During typical operation of the wireless communication system, the base stations 270 receive sets of reverse-link signals from various mobile terminals 100. The mobile terminals 100 are engaging in calls, messaging, and other communications. Each reverse-link signal received by a given base station 270 is processed within that base station. The resulting data is forwarded to an associated BSC 275. The BSC provides call resource allocation and mobility management functionality including the orchestration of soft handoffs between base stations 270. The BSCs 275 also route the received data to the MSC 280, which provides additional routing services for interfacing with the PSTN 290. Similarly, the PSTN interfaces with the MSC 280, and the MSC interfaces with the BSCs 275, which in turn control the base stations 270 to transmit sets of forward-link signals to the mobile terminals 100.

For clarity and convenience of the following description, the mobile terminal 100 described in the following description includes at least one of the elements shown in FIG. 1. The mobile terminal 100 is typically able to perform a broadcast mode corresponding to each of at least one or more broadcast service providers, thus outputting broadcasting/multimedia contents received from the at least one or more broadcast service providers via the output unit 150. Typically, the broadcast service provider operates a server for transmitting broadcast relevant data to at least one mobile terminal 100. A frequency or frequency band for transmitting the broadcast relevant data can be assigned to at least one broadcast service provider.

Figure 5:
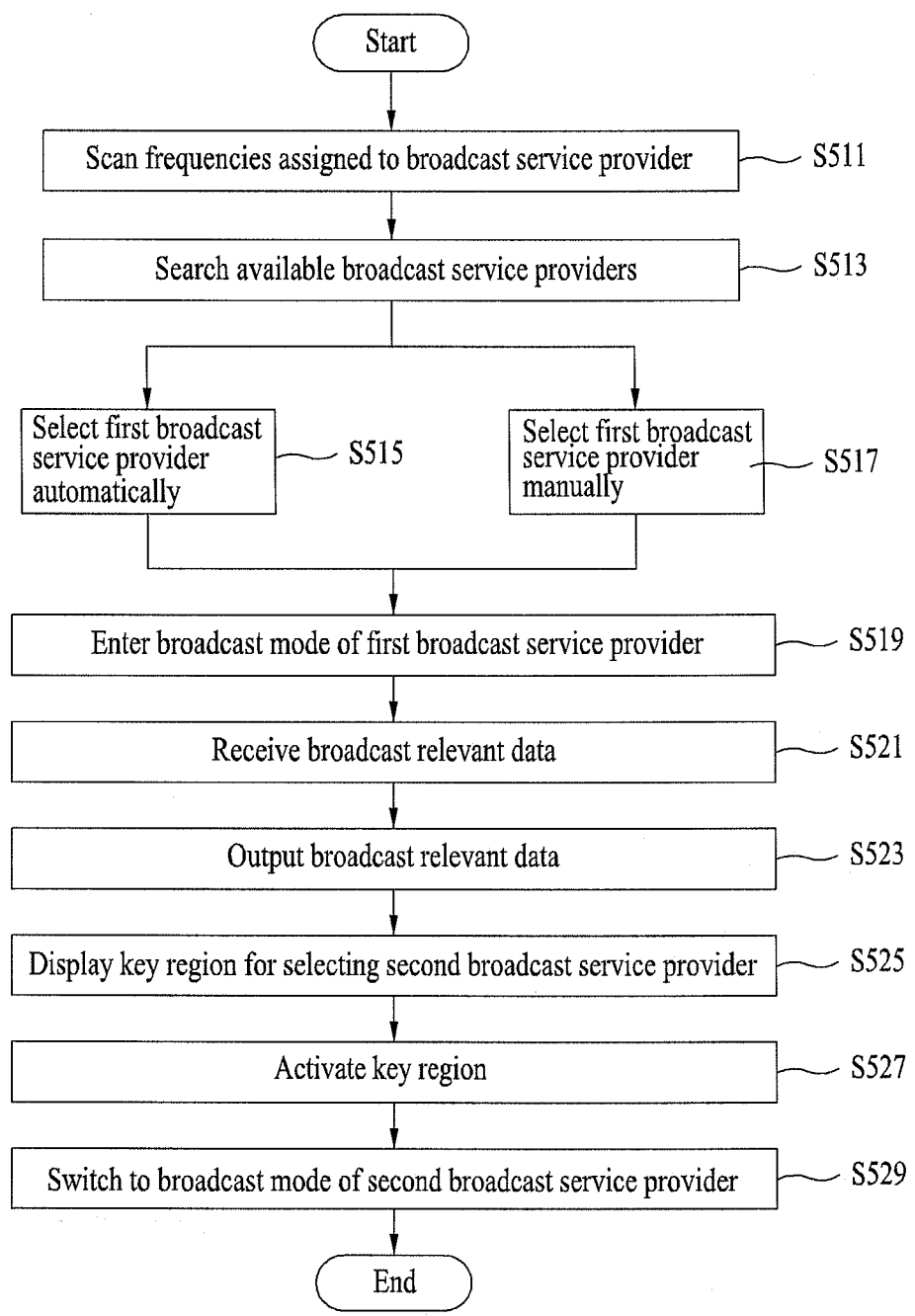
FIG. 5 is a flowchart illustrating selecting a broadcast service provider in a mobile terminal according to an embodiment of the present invention.

In the following description, a process of selecting a broadcast service provider in a mobile terminal according to an embodiment of the present invention is explained. Referring to FIG. 5, the mobile terminal 100 scans frequencies assigned to each of a plurality of broadcast service providers via the wireless communication unit 110 [S511].

The mobile terminal 100 performs the scanning in S511 when a broadcast viewing function or a frequency scanning function is selected by a user via the user input unit 130. According to the result of the scanning in S511, the mobile terminal 100 receives or obtains data about at least one or more broadcast service providers available in a current network via the wireless communication unit 130. Further, the mobile terminal 100 may store the obtained data about each of the plurality of broadcast service providers in the memory 160.

The obtained data about each of the plurality of broadcast service providers may include identification information on each of the at least one or more broadcast service providers available in the current network status. Hence, the mobile terminal 100 is able to identify each of the at least one or more available broadcast service providers using the identification information. For example, the controller 180 searches the memory 160 for the identification information and identifies the broadcast service provider corresponding to the searched identification information.

In the following description, a data structure containing the identification information is explained. As shown in FIGS. 6A to 6E, a platform ID, a transport stream ID, an original network ID and the like in the SI (service information)/PSI (program specific information) table type data are used as the identification information in DVB-H.

Referring to FIG. 6A, the transport stream ID and original network ID can be included as identification information in a service description table that is an example of the SI/PSI table. Referring to FIG. 6B, the platform ID can be included as identification information in a network information table that is an example of the SI/PSI table. Referring to FIG. 6C, the platform ID can be included as identification information in a program map table that is an example of the SI/PSI table. Referring to FIG. 6D, the platform ID can be included as identification information in an IP/MAC notification table that is an example of the SI/PSI table. Referring to FIG. 6E, the transform stream ID and original network ID can be included as identification information in a network information table that is an example of the SI/PSI table.

When a designated specific broadcast service provider (hereinafter "designated service provider") exists, the mobile terminal 100 may not need to identify the broadcast service provider using the above-described identification information.

Referring back to FIG. 5, in S511, the mobile terminal 100 scans frequencies assigned to each of the at least one or more broadcast service providers. For example, the mobile terminal 100 scans a frequency assigned to a designated service provider, or frequencies assigned to a designated service provider and other broadcast service providers.

In particular, according to an authority mode set for a broadcast service provider, the mobile terminal 100 may select a designated service provider or another broadcast service provider as a target broadcast service provider for scanning. In the following description, a process for setting an authority mode for a broadcast service provider is explained.

Figure 7:
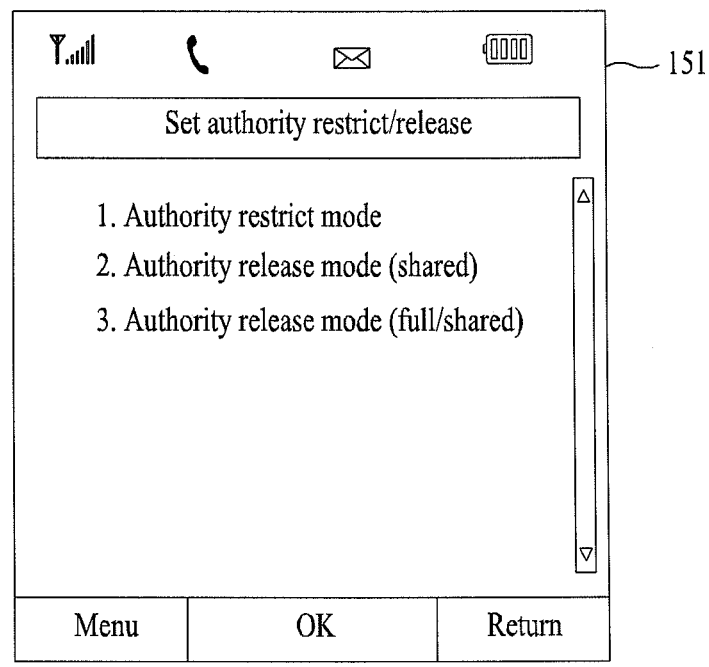
FIG. 7 shows a screen on which a process for setting an authority mode for a broadcast service provider is displayed in a mobile terminal according to an embodiment of the present invention.

Referring to FIG. 7, the mobile terminal 100 enters an authority restriction/setting mode according to a user's selection received via the user input unit 130 and then displays a list including at least one or more selectable authority modes on the display 151. If the 'authority restriction mode' is selected from the list shown in FIG. 7, the mobile terminal 100 scans a frequency assigned to a designated service provider only. For example, in DVB-H, such authority restriction mode is called "lock mode", "CAS (conditional access system) ON mode" or "designated service provider only mode".

If "authority release mode (shared)" or "authority release mode (full/shared)" is selected from the list shown in FIG. 7, the mobile terminal 100 scans a frequency assigned to a designated service provider and frequencies assigned to different broadcast service providers. For example, at least one of the different broadcast service providers may have a previous agreement with the designated service provider to provide a broadcast signal via a specific one of the channels provided by the at least one of the different broadcast service providers.

The specific channel may be one of the channels provided by a prescribed broadcast service provider to allow a mobile terminal 100, to which a different broadcast service provider is designated, to use the corresponding channel. In the following description, the specific channel is named a shared channel. For example, in DVB-H, the specific channel is called "clear channel".

In particular, if the authority release mode (shared) is selected, the mobile terminal 100 can be provided with a shared channel of a frequency-scanned designated service provider and a shared channel of a different service provider. If the authority release mode (full/shared) is selected, the mobile terminal 100 can be provided with a full channel and a shared channel from each of a frequency-scanned designated service provider and a different service provider.

Referring back to FIG. 5, the mobile terminal 100 searches at least one or more available broadcast service providers using the scan result from S511 (S513). For example, the mobile terminal 100 searches the at least one or more available broadcast service providers for a specific broadcast service provider according to a selection signal received from a user. In this case, the mobile terminal 100 designates the specific broadcast service provider according to the selection signal prior to the searching available broadcast service providers in S513.

Figure 8A:
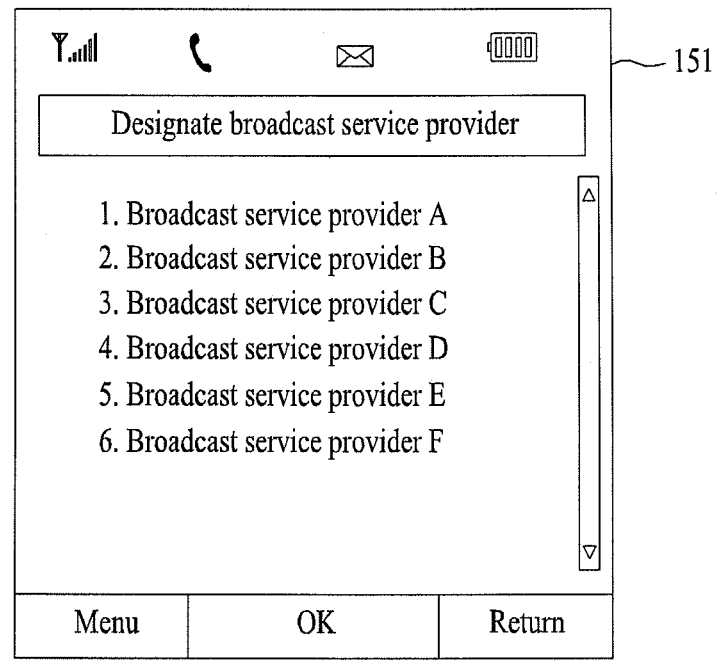
FIG. 8A and FIG. 8B show a screen on which a process for specifying a broadcast service provider is displayed in a mobile terminal according to an embodiment of the present invention.

A process of designating a broadcast service provider is explained in the following description. Referring to FIG. 8A, when a function for designating a broadcast service provider is selected according to a user's selection action via the user input unit 130, the mobile terminal 100 displays a list of selectable broadcast service providers through the display 151. The mobile terminal 100 may store names of the selectable broadcast service providers in the memory 160 or may receive name information of the selectable broadcast service providers via the wireless communication unit 130. If a specific broadcast service provider is selected from a list shown in FIG. 8A, the mobile terminal 100 designates the selected specific broadcast service provider as a search target broadcast service provider.

Figure 8B:
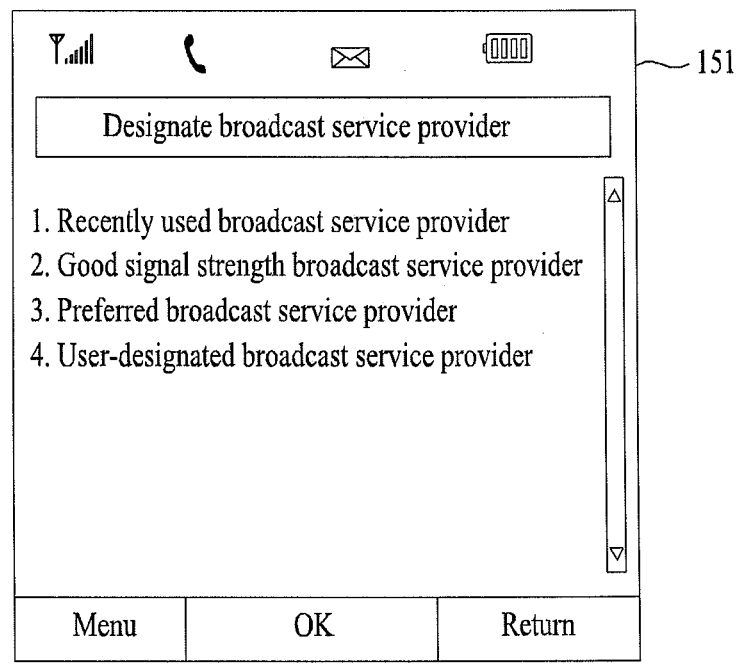

Alternatively, referring to FIG. 8B, when a function for designating a broadcast service provider is selected according to a user's selection action via the user input unit 130, the mobile terminal 100 may display a broadcast service provider list categorizing broadcast service providers according to their characteristics via the display 151. For example, the categorized broadcast service provider list includes a recently used broadcast service provider, a good signal strength broadcast service provider, a preferred broadcast service provider and a user-designated broadcast service provider. If the recently used broadcast service provider is selected from the list shown in FIG. 8B, the mobile terminal 100 designates the recently used broadcast service provider as a search target broadcast service provider.

Referring back to FIG. 5, since the identification information obtained from the scan result and the broadcast service provider information, such as a name, are stored in the memory 160, the mobile terminal 100 searches the memory for the broadcast service provider corresponding to the identification information. The mobile terminal 100 displays a broadcast service provider list including the at least one or more available broadcast service providers searched in S513 on the display 151.

Figure 9:
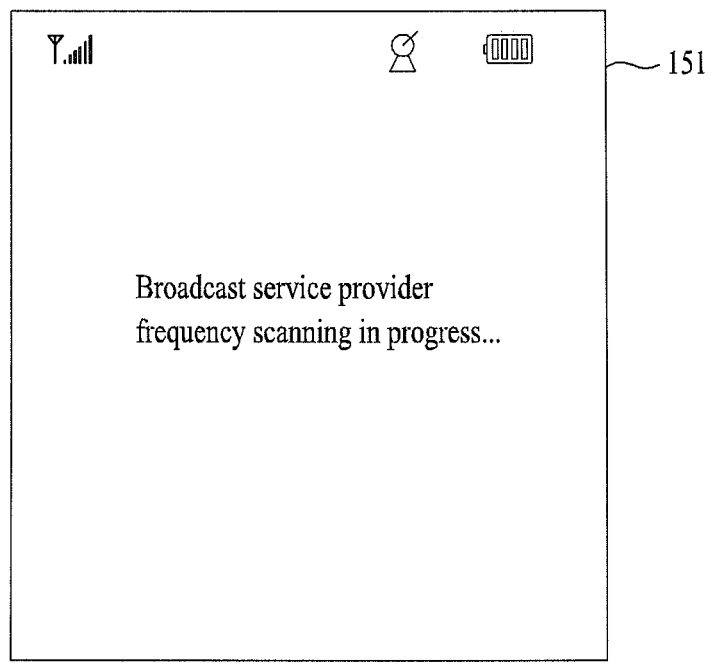
FIG. 9 shows a screen on which a process for scanning frequencies assigned to broadcast service providers is displayed in a mobile terminal according to an embodiment of the present invention.

In the following description, a process of searching a broadcast service provider in a mobile terminal according to an embodiment of the present invention is explained with reference to FIGS. 9 to 10B. Referring to FIG. 9, the mobile terminal 100 indicates that a frequency scan is currently in progress via the output unit 150, in particular, via the display 151 when performing the frequency scan in S511.

Figure 10A:
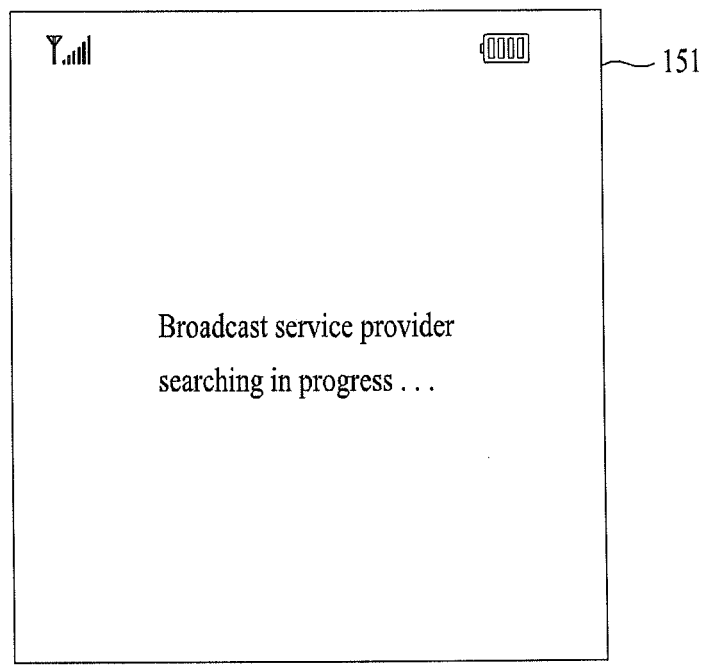
FIG. 10A and FIG. 10B show a screen on which a process for searching a broadcast service provider is displayed in a mobile terminal according to an embodiment of the present invention.
Figure 10A:
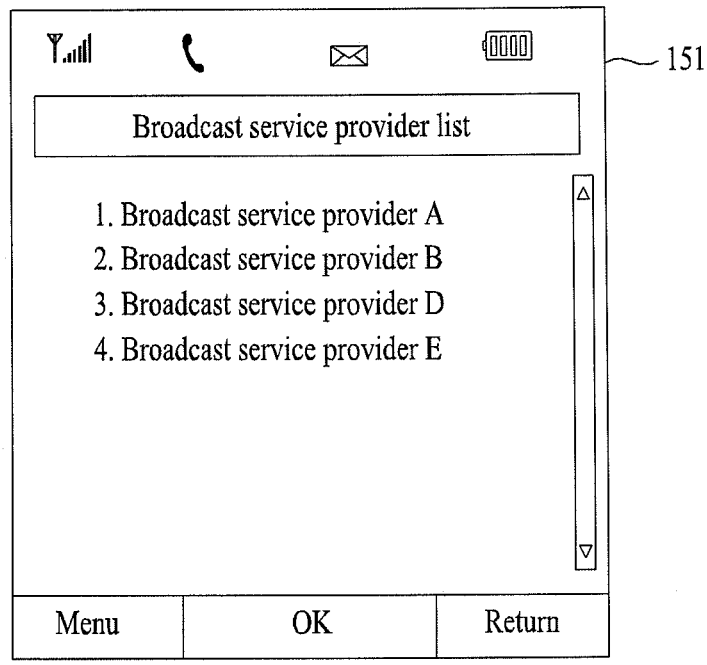

If the scanning in S511 is completed, referring to FIG. 10A, the mobile terminal 100 indicates that broadcast service provider searching is currently in progress via the output unit 150, in particular, via the display 151 while searching at least one available broadcast service provider using the scan result (FIG. 10A(a)). Once the search is completed, the mobile terminal 100 displays a broadcast service provider list including all the available broadcast service providers among the searched broadcast service providers on the screen (FIG. 10A(b)). As an example, an available broadcast service provider is one in which the mobile terminal receives a signal that meets a signal threshold. Conversely, as described in more detail below, an unavailable broadcast service provider is one in which the mobile terminal receivers a signal that falls below a signal threshold. Further examples of the availability and unavailability of a broadcast service provider are set forth throughout the present disclosure.

Figure 10B:
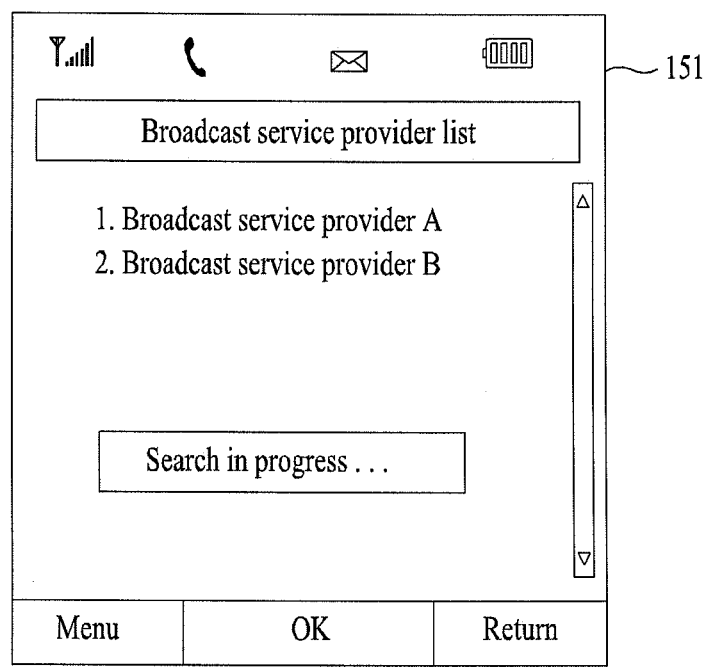

After completion of the scanning in S511, referring to FIG. 10B, the mobile terminal 100 displays the broadcast service provider list in real time according to the search result while continuing searching at least one or more available broadcast service providers according to the scan result. In FIG. 10B, the mobile terminal 100 indicates that the broadcast service provider searching is currently in progress while updating the broadcast service provider list in real time according to the search result.

In the above described drawings, at least one of various methods including text, an icon, vibration, illumination, animation, flash and the like can be used to indicate that the broadcast service provider scan or search is in progress. Referring back to FIG. 5, the mobile terminal 100 selects a specific broadcast service provider or a first broadcast service provider from the at least one or more available broadcast service providers searched in S513 (S515, S517).

Alternatively, if the searching in S513 is skipped, the mobile terminal 100 checks the at least one or more available broadcast service providers from the scan result obtained in S511 and then selects the first broadcast service provider from the checked at least one available broadcast service providers.

In one aspect of the present invention, the mobile terminal 100 automatically selects the first broadcast service provider from the at least one or more available broadcast service providers (S515). Prior to the selecting in S515, the mobile terminal 100 designates a specific broadcast service provider or a broadcast service provider, which meets a specific condition or category, such as recently used, good signal strength, preferred, and user-designated, as an automatic selection target broadcast service provider according to a user's selection action via the user input unit 130. The process of designating the search target broadcast service provider is discussed above with reference to FIGS. 8A and 8B. Alternatively, regardless of the user's selection action, the mobile terminal 100 may randomly designate the broadcast service provider meeting the specific condition as the automatic selection target broadcast service provider.

Figure 11A:
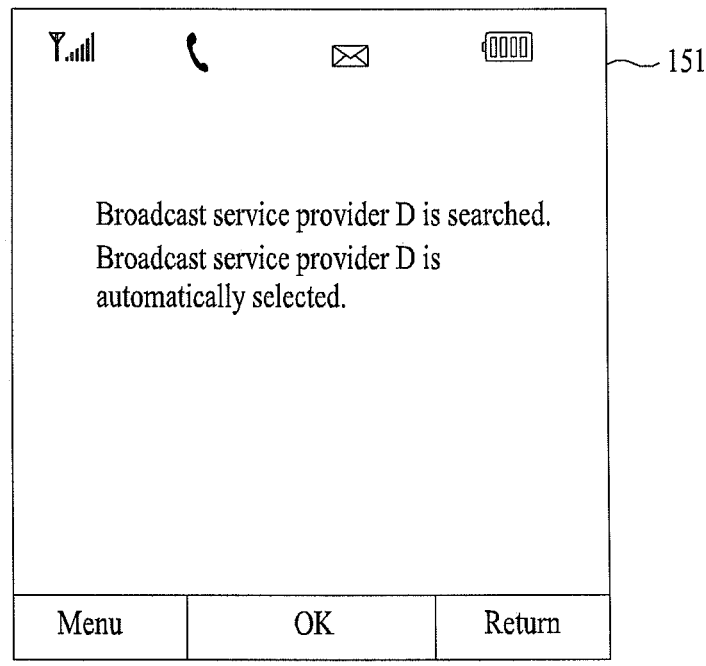
FIG. 11A and FIG. 11B show a screen on which a process for automatically selecting a broadcast service provider is displayed in a mobile terminal according to an embodiment of the present invention.

In the following description, a process of automatically selecting a broadcast service provider when a broadcast service provider D is designated as a first broadcast service provider is explained with reference to FIG. 11A and FIG. 11B. Referring to FIG. 11A, if the broadcast service provider D is searched, the mobile terminal 100 automatically selects the broadcast service provider D and then informs a user of the selected broadcast service provider D.

Figure 11B:
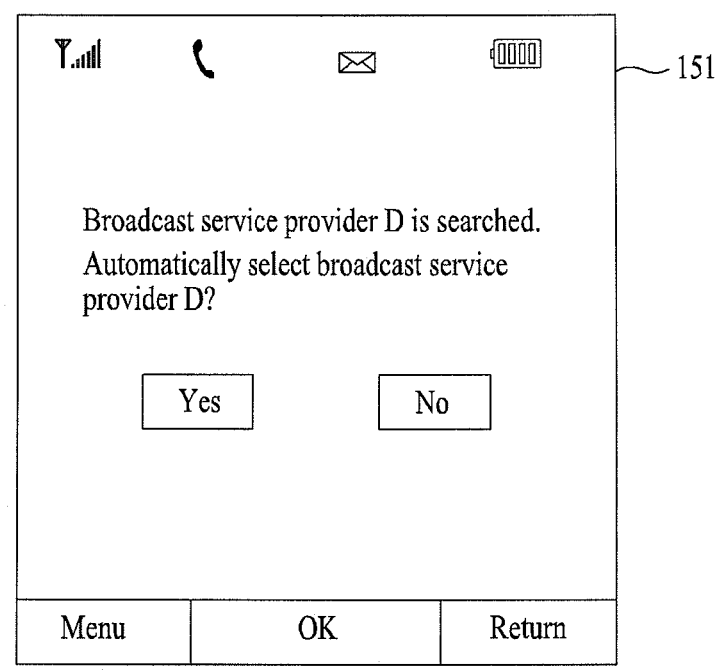

Referring to FIG. 11B, if a broadcast service provider D is searched, the mobile terminal 100 informs a user that the broadcast service provider D is searched and prompts the user to select whether to automatically select the broadcast service provider D. If the user selects the automatic selection ("yes"), the mobile terminal 100 selects the broadcast service provider D. Optionally, the mobile terminal 100 may display a broadcast service provider list according to the search result in FIG. 11A or FIG. 11B Referring back to FIG. 5, when selecting the broadcast service provider in S515, if there exists only one available broadcast service provider as a result of the searching in S513, the mobile terminal 100 automatically selects the one available broadcast service provider as the first broadcast service provider. In the following description, a case when there is one available broadcast service provider is explained as an example of the present invention.

Figure 12A:
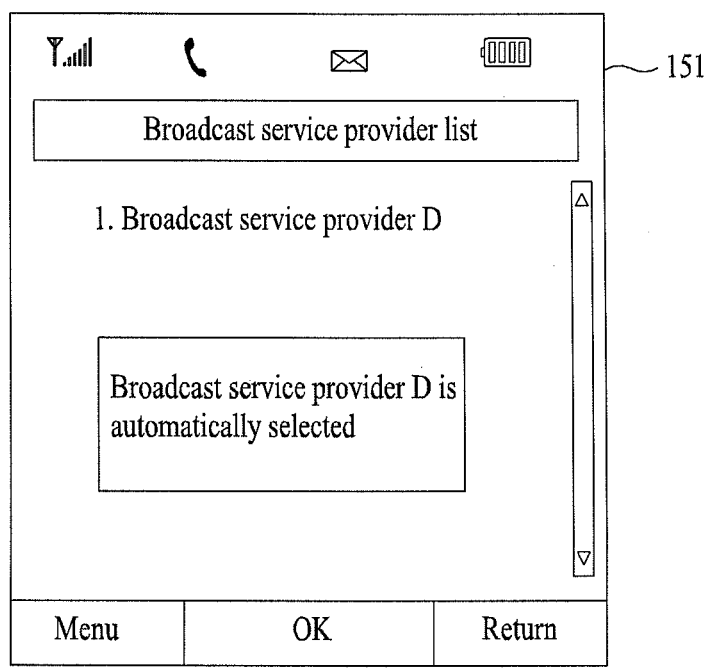
FIG. 12A and FIG. 12B show a screen on which a process for automatically selecting a broadcast service provider is displayed in a mobile terminal according to an embodiment of the present invention.

Referring to FIG. 12A, if broadcast service provider D is searched as an available broadcast service provider, the mobile terminal 100 automatically selects the broadcast service provider D and then informs a user of the selected broadcast service provider D. In this case, even if broadcast service provider A is designated as an automatic selection target broadcast service provider, since the broadcast service provider A is not available, the mobile terminal 100 automatically selects the broadcast service provider D. This will be explained in detail later.

When automatically selecting the broadcast service provider in S515, if a specific broadcast service provider designated as an automatic selection target broadcast service provider is found prior to completion of the searching in S513, the mobile terminal 100 automatically selects the specific broadcast service provider as a first broadcast service provider even when the searching in S513 is not completed yet. The following description illustrates a case when a specific broadcast service provider, which was previously designated as a first broadcast service provider, is found prior to completion of the searching. In this example, the specific broadcast service provider is broadcast service provider D as shown in FIG. 12B.

Figure 12B:
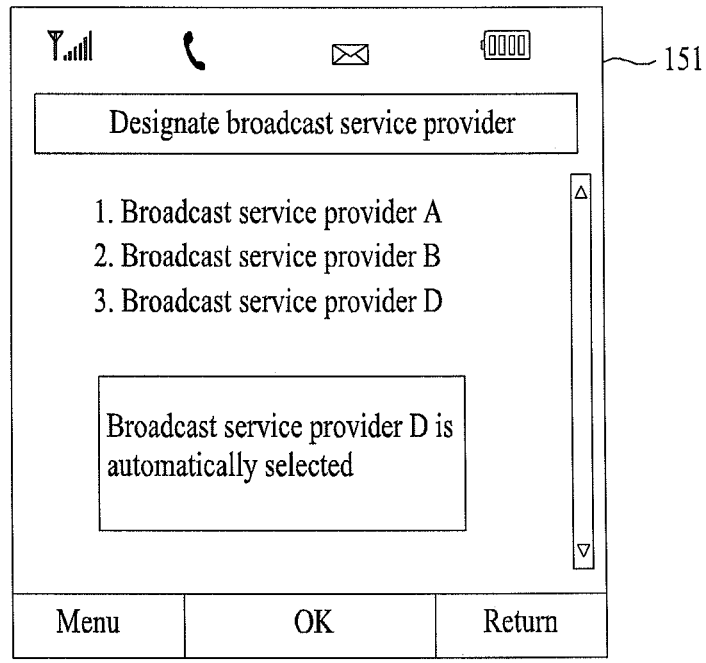
Figure 12B:
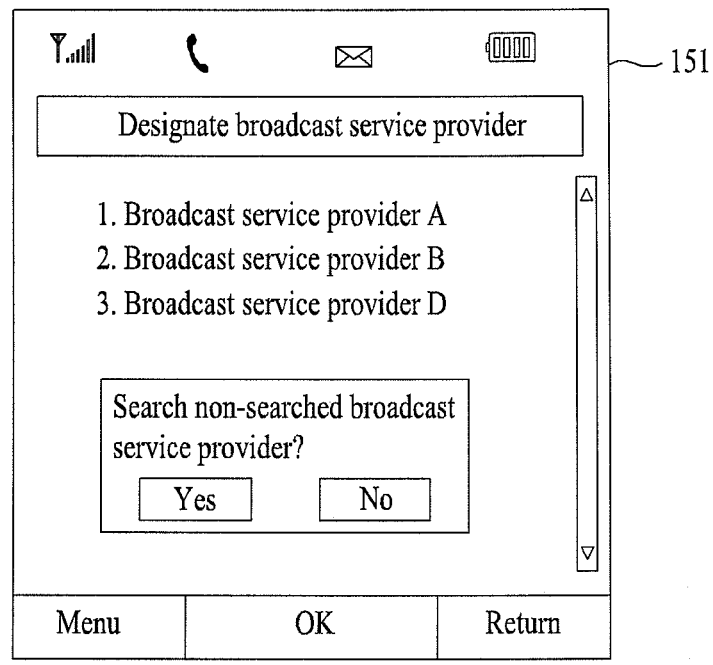

Referring to FIG. 12B, if broadcast service provider D is found prior to completion of the searching in S513, the mobile terminal 100 automatically selects the broadcast service provider D and then informs a user of the selected broadcast service provider D (FIG. 12B(a)). Optionally, the mobile terminal 100 may also display a broadcast service provider list generated according to a real-time search result.

As the broadcast service provider D is automatically selected prior to the completion of the searching, the mobile terminal 100 may further display a window for prompting the user to select whether to continue the searching for a non-searched broadcast service provider (FIG. 12B(b)). If the user selects to continue the search ("yes"), the mobile terminal 100 continues searching the non-searched broadcast service provider periodically or randomly.

In one aspect of the present invention, the mobile terminal 100 selects a first broadcast service provider from at least one or more available broadcast service providers according to a user's selecting action received via the user input unit 130 (S517). In other words, the first broadcast service provider is selected manually by the user.

Figure 13A:
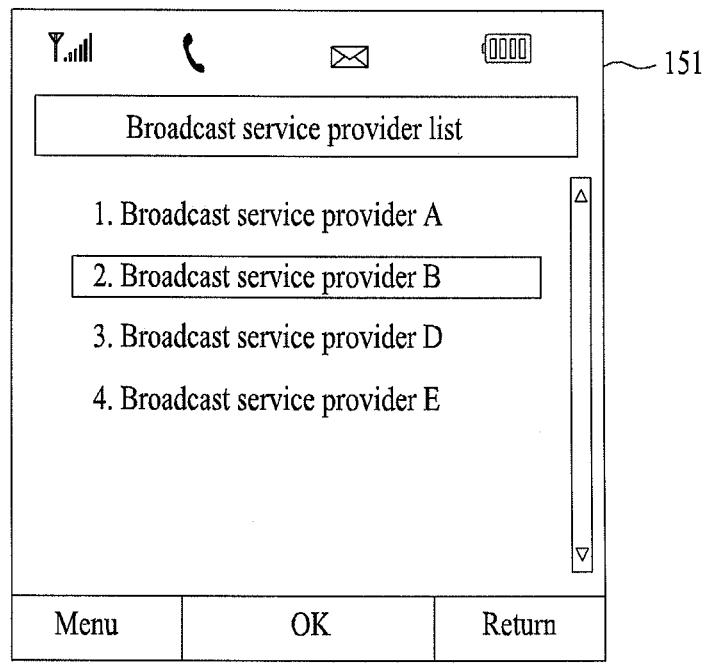
FIG. 13A and FIG. 13B show a screen on which a process for manually selecting a broadcast service provider is displayed in a mobile terminal according to an embodiment of the present invention.
Figure 13B:
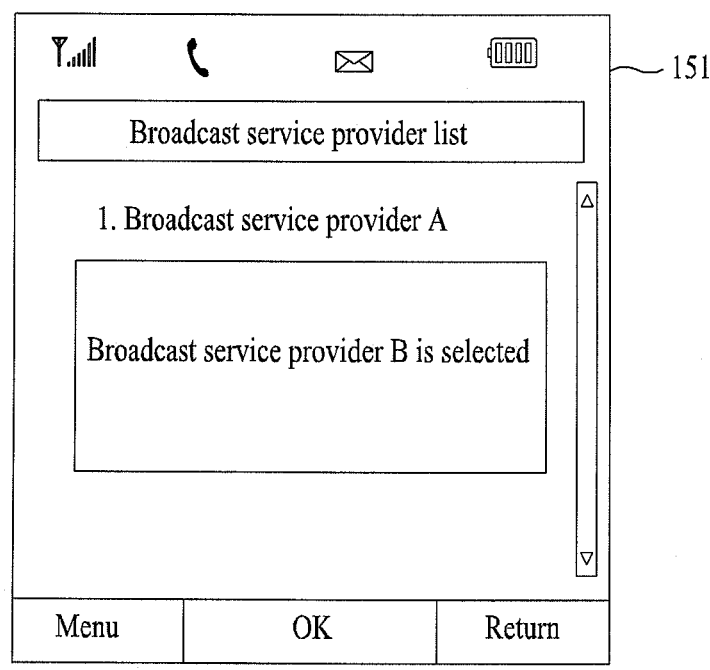

In the following description, a process of selecting a broadcast service provider manually is explained with reference to FIG. 13A and FIG. 13B. Referring to FIG. 13A, the mobile terminal 100 displays a broadcast service provider list including at least one or more available broadcast service providers via the display 151. If broadcast service provider B is selected from the broadcast service provider list, the mobile terminal 100 selects the broadcast service provider B as the first broadcast service provider, as shown in FIG. 13B.

In one aspect of the present invention, once a broadcast service provider, which has been previously designated as an automatic selection target broadcast service provider, is selected according to the result of the scanning in S511, the mobile terminal 100 is able to select a different broadcast service provider. In the following description, a process of selecting a different broadcast service provider when a broadcast service provider previously designated as an automatic selection target broadcast service provider is not available is explained with reference to FIGS. 14A to 14C. In this example, the broadcast service provider previously designated as the automatic selection target broadcast service provider is broadcast service provider C.

Figure 14A:
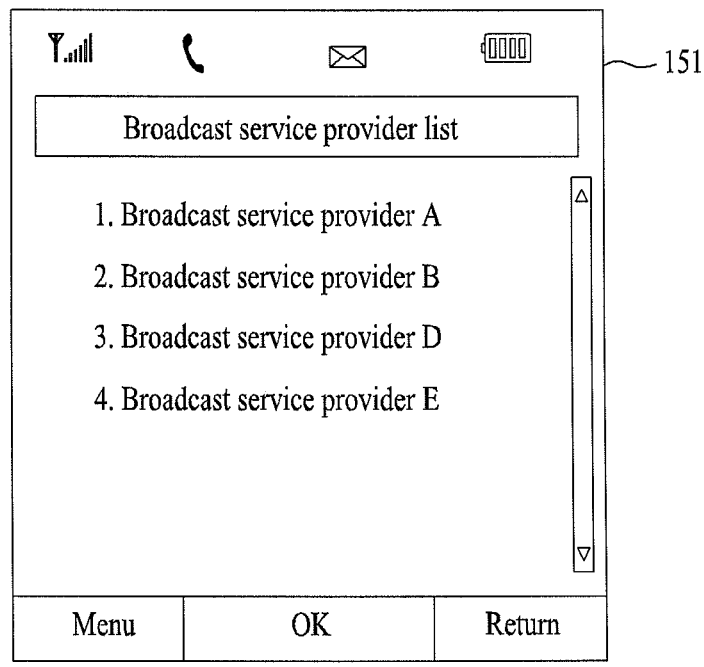
FIGS. 14A to 14C show a screen on which a process for selecting a different broadcast service provider is displayed in a mobile terminal according to an embodiment of the present invention when a specified broadcast service provider is not available.

Referring to FIG. 14A, the mobile terminal 100 displays a broadcast service provider list including an available broadcast service provider via the display 151 and then selects a specific broadcast service provider from the displayed broadcast service provider list according to a user's selection action received via the user input unit 130.

Figure 14B:
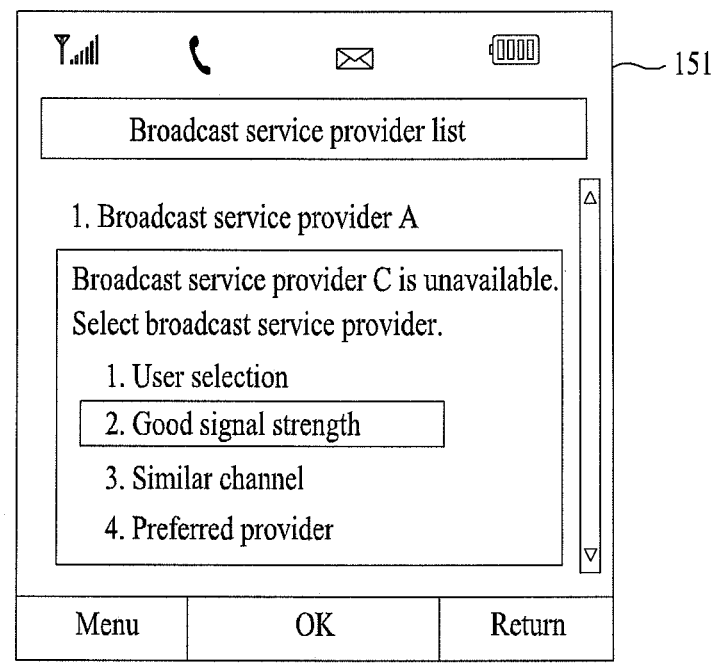

Referring to FIG. 14B, the mobile terminal 100 displays a selection category list including categories or conditions for selecting a broadcast service provider while indicating that the broadcast service provider C is currently unavailable, via the display 151. For example, if "good signal strength" is selected from the selection category list, the mobile terminal 100 selects a broadcast service provider having the strongest signal from at least one or more available broadcast service providers.

Figure 14C:
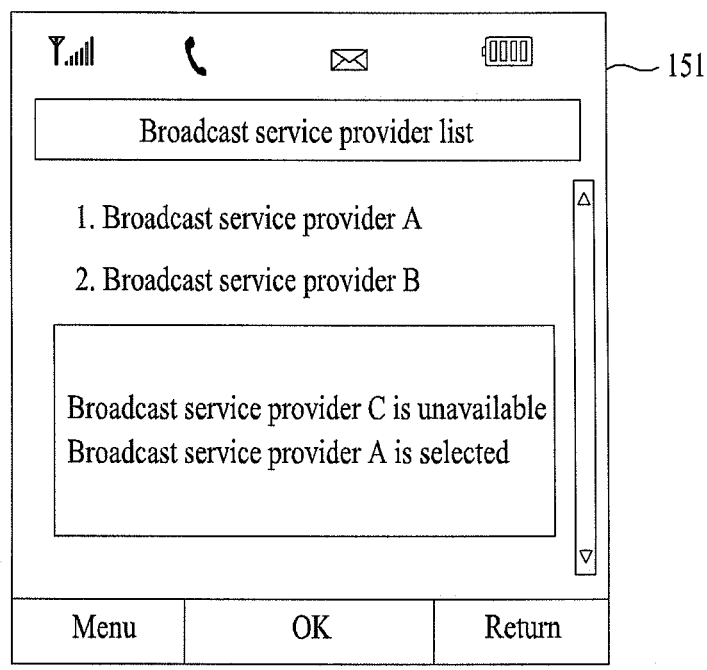

Referring to FIG. 14C, the mobile terminal 100 selects a specific broadcast service provider and indicates that the specific broadcast service provider is selected via the display 151. For example, the specific broadcast service provider has been previously designated by a user or may be randomly selected by the mobile terminal 100.

The mobile terminal 100 may function to check availability of a broadcast service provider previously designated as an automatic selection target broadcast service provider while entering the broadcast mode corresponding to a different broadcast service provider selected by a user via the user input unit 130, as described in any one of FIGS. 14A to 14C. This will be explained in detail later.

Referring back to FIG. 5, the mobile terminal 100 enters a first broadcast mode corresponding to the first broadcast service provider selected in S515 or S517 (S519). The broadcast mode refers to a mode for receiving broadcast relevant data from a broadcast service provider and outputting the same, and typically, the broadcast mode differs for each broadcast service provider. As the first broadcast mode is entered, the controller 180 controls the respective elements to perform operations according to the first broadcast mode entry.

If the different broadcast service provider is selected, the mobile terminal 100 enters a different broadcast mode corresponding to the different broadcast service provider. As the first broadcast mode is entered, the mobile terminal 100 receives broadcast relevant data from the first broadcast service provider or a broadcast managing server operated by the first broadcast service provider via the wireless communication unit 110, in particular, via the broadcast receiving module 11 (S521). Further, as the different broadcast mode is entered, the mobile terminal 100 receives broadcast relevant data from the different broadcast service provider or a broadcast managing server operated by the different broadcast service provider via the wireless communication unit 110, in particular, via the broadcast receiving module 11 (S521).

For example, the broadcast relevant data includes at least one of broadcast guide information or broadcast data. The broadcast guide information is guide information required for the broadcast reception and output. For example, the broadcast guide information includes EPG of DMB, ESG data of DVB-H and the like. And, the broadcast data includes at least one of audio data or video data.

Subsequently, the mobile terminal 100 outputs the broadcast relevant data received in S521 via the output unit 150 (S523). In the following description, the reception and output of the broadcast relevant data is explained, the broadcast relevant data being divided into the broadcast guide information and the broadcast data.

When entering a first broadcast mode, the mobile terminal 100 receives broadcast guide information from a first broadcast service provider or a server operated and managed by the first broadcast service provider via the wireless communication unit 110, in particular, the broadcast receiving module 111. The broadcast guide information may be received periodically or randomly when the first broadcast mode is entered. Further, the broadcast guide information may be updated over the previously-stored broadcast guide information when the broadcast guide information is received. Moreover, the broadcast guide information can be stored in the memory 160.

Consider the case when reception of the broadcast guide information fails, such that the mobile terminal 100 returns to the broadcast service provider selection of S515 or S517. If the broadcast guide information is not received, the broadcast reception and output is impossible. Therefore, a different broadcast service provider should be selected.

Subsequently, the mobile terminal 100 displays broadcast schedule information, which is generated according to the broadcast guide information, on the screen of the display 151. For example, the broadcast schedule information includes title, broadcast time, summary of a broadcast program for a broadcast channel, and the like. If a user selects a broadcast channel from the broadcast schedule information, the mobile terminal 100 outputs broadcast data provided from the selected broadcast channel via the output unit 150.

Alternatively, if the reception of the broadcast guide information is successful, the mobile terminal 100 automatically selects a specific broadcast channel, for example, a recently used broadcast channel, a preferred broadcast channel, a broadcast channel having a quickly accessible channel number, without outputting the broadcast guide information, thus outputting a broadcast channel provided from the automatically selected specific broadcast channel. In the following description, the reception and output operations of broadcast relevant data according to a broadcast mode entry are explained.

Figure 15A:
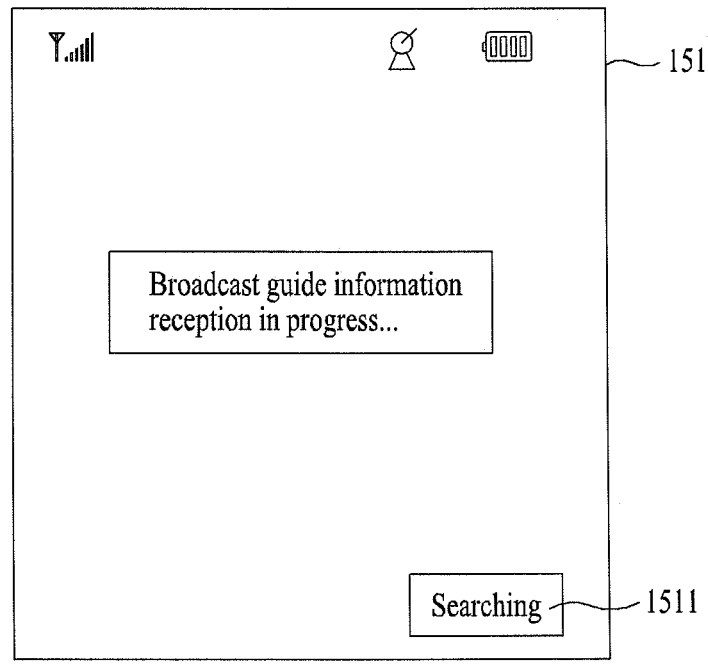
FIGS. 15A to 15C show a screen displaying a process of selecting a specific broadcast program from a list of broadcast information or programs related to a selected broadcast service provider and outputting data corresponding to the selected broadcast information or program in a mobile terminal according to an embodiment of the present invention.

In the following examples, a first broadcast service provider refers to an automatically selected broadcast service provider (S515) or a manually selected broadcast service provider (S517). Referring to FIG. 15A, the mobile terminal 100 indicates that reception of broadcast guide information is in progress while receiving the broadcast guide information corresponding to a first broadcast service provider. The reception of the broadcast guide information may be indicated by at least one of an icon, text, a symbol, an image, animation, flash or the like. Optionally, a progressive bar may be displayed to show the progress of the broadcast guide information reception.

Figure 15B:
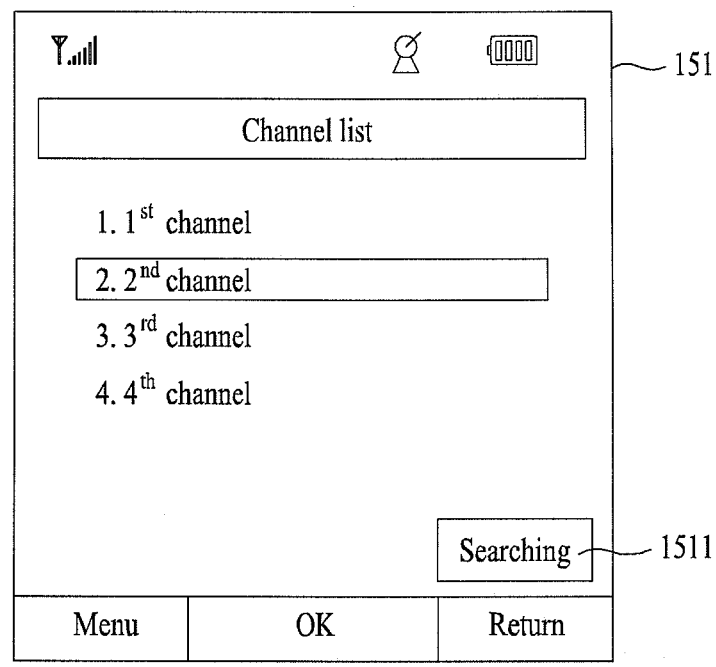

Referring to FIG. 15B, when the broadcast guide information is received, the mobile terminal 100 displays a broadcast channel list or broadcast program list based on the received broadcast guide information.

Figure 15C:
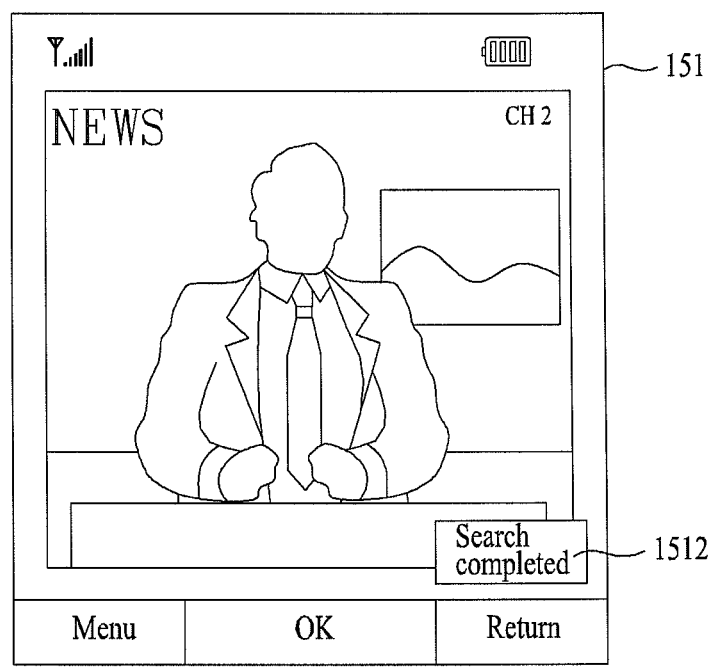

Referring to FIG. 15C, if a specific channel or program, for example, "$2^{nd}$ channel" is selected from the broadcast channel list or broadcast program list, as shown in FIG. 15B, the mobile terminal 100 receives broadcast data via the selected specific channel and outputs the broadcast data received from the $2^{nd}$ channel or "CH2," as shown in FIG. 15C. Alternatively, if only one broadcast channel or broadcast program, for example, only "CH2", is available from the selected broadcast service provider, the mobile terminal 100 may automatically receive broadcast data via the only available broadcast channel or broadcast program and output the received broadcast data via the display 151 without displaying the broadcast channel list or broadcast program list, as shown in FIG. 15C.

If the first broadcast service provider was selected prior to completion of the searching in S513, and searching of a broadcast service provider was continued (for example, "yes" is selected in FIG. 12B(b)), the mobile terminal 100 continues the search operation for the non-searched broadcast service provider. While the searching is in progress, the mobile terminal 100 indicates that the searching is in progress using an icon 1511 or the like displayed on a prescribed region of the display screen 151 (FIG. 15A or FIG. 15B). When the searching is completed, the mobile terminal 100 indicates the completion of the search using an icon 1512 or the like displayed on a prescribed region of the display screen 151 (FIG. 15C).

In the following examples, a different broadcast service provider refers to a broadcast service provider selected when a broadcast service provider designated as an automatic selection target (hereinafter 'broadcast service provider A') is unavailable. In this case, the frequency scan operation in S511 may continue to search the designated service provider according to a user selection via the mobile terminal 100 or by default. Therefore, availability of the broadcast service provider A is determined via the frequency scan operation.

Figure 16A:
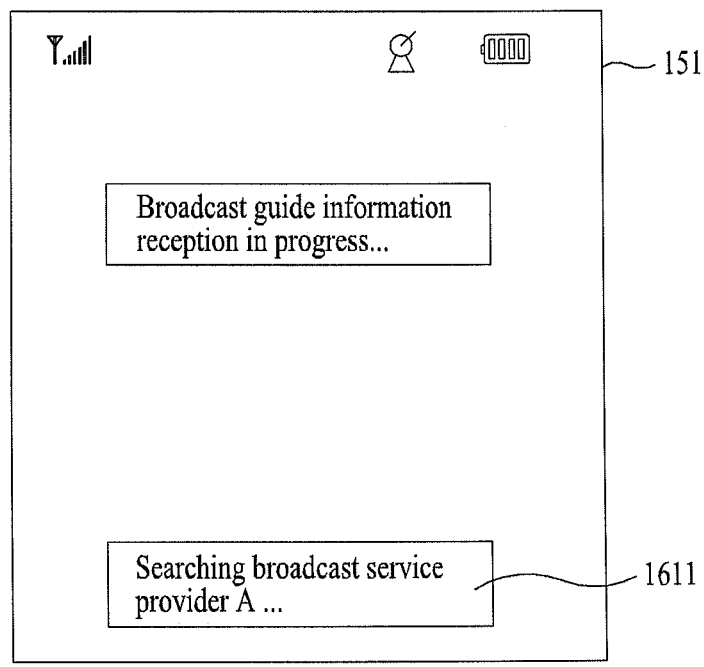
FIGS. 16A to 16C show a screen displaying a process of continuously searching a designated broadcast service provider while a broadcast program of a selected broadcast service provider is being output when the designated broadcast service provider was not previously available in a mobile terminal according to an embodiment of the present invention.

Referring to FIG. 16A, the mobile terminal 100 indicates that reception of broadcast guide information is in progress while receiving broadcast guide information corresponding to the selected different broadcast service provider.

Figure 16B:
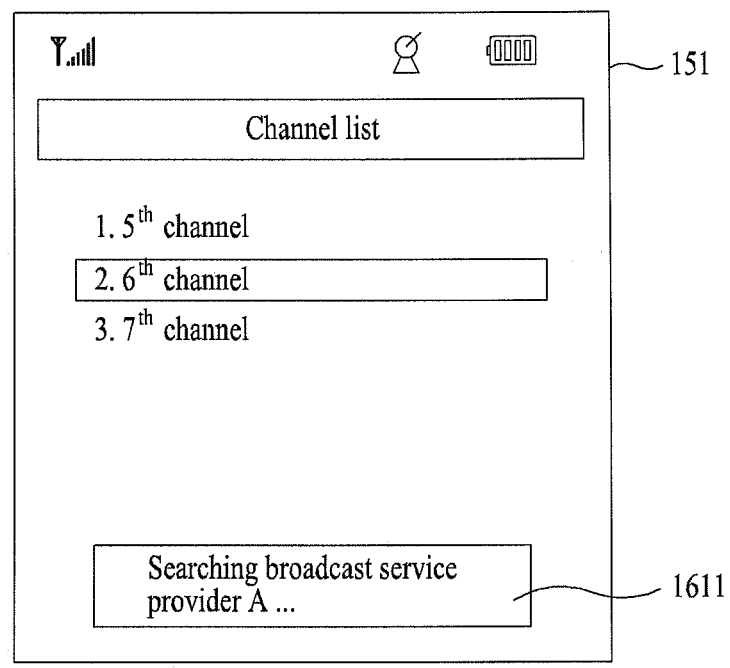

Referring to FIG. 16B, when the broadcast guide information is received, the mobile terminal 100 displays a broadcast channel list or program list based on the received broadcast guide information. As shown in FIG. 16A or FIG. 16B, the mobile terminal 100 may also indicate that the broadcast service provider A is still being searched via a window 1611. Searching of the broadcast service provider A may also be indicated by at least one of an icon, text, a symbol, an image, animation, flash or the like.

Figure 16C:
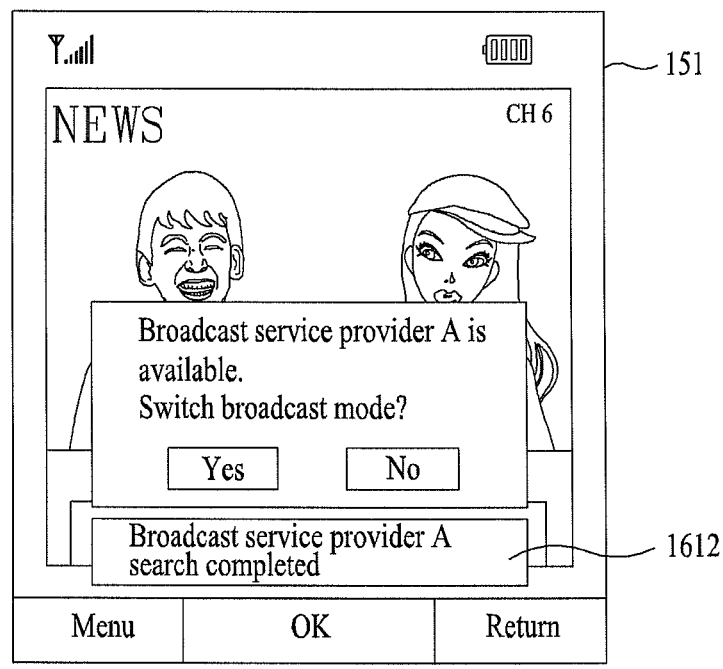

Referring to FIG. 16C, when a specific channel, for example, "$6^{th}$ channel" is selected from the broadcast channel list or program list as shown in FIG. 16B, the mobile terminal 100 receives broadcast data from the selected specific channel and outputs the broadcast data received from the $6^{th}$ channel or "CH6," as shown in FIG. 16C. Further referring to FIG. 16C, if the broadcast service provider A is searched while outputting the broadcast data received from the $6^{th}$ channel of the different broadcast service provider, the mobile terminal 100 indicates that the broadcast service provider A is available and/or displays a window 1612 for prompting a user to switch to a broadcast mode corresponding to the broadcast service provider A (hereinafter "broadcast mode A"). Alternatively, the mobile terminal 100 may automatically enter the broadcast mode A by default upon searching the broadcast service provider A.

Referring back to FIG. 5, the mobile terminal 100 displays a key region for selecting a second or different broadcast service provider among the at least one or more available broadcast service providers via the display 151 while maintaining the display operation according to the entered broadcast mode or the output operation in S523 (S525). When the key region displayed in S525 is activated (S527), the mobile terminal 100 switches from the current broadcast mode to a broadcast mode corresponding to a second or different broadcast service provider (hereinafter "second/different broadcast mode") (S529).

For example, the mobile terminal 100 receives an input via the user input unit 130 and activates the displayed key region responsive to the received input. In this case, the second broadcast service provider or different broadcast service provider includes at least one of an available broadcast service provider, a previous/next broadcast service provider, a preferred broadcast service provider, a user-designated broadcast service provider, a terminal-designated broadcast service provider, a broadcast service provider with a good signal strength, or a broadcast service provider providing a similar channel or program.

In the following description, a process of displaying a key region for selecting a different or second broadcast service provider in a mobile terminal 100 is explained with reference to FIGS. 17 to 23B. When the different or second broadcast service provider is selected, if only one broadcast channel or broadcast program is available, the mobile terminal 100 displays a channel or program list including the only available broadcast channel or broadcast program. Alternatively, the mobile terminal 100 may automatically output multimedia content corresponding to the only one available broadcast channel or broadcast program without displaying the channel or program list if only one broadcast channel or broadcast program is available from the selected different or second broadcast service provider.

Figure 17:
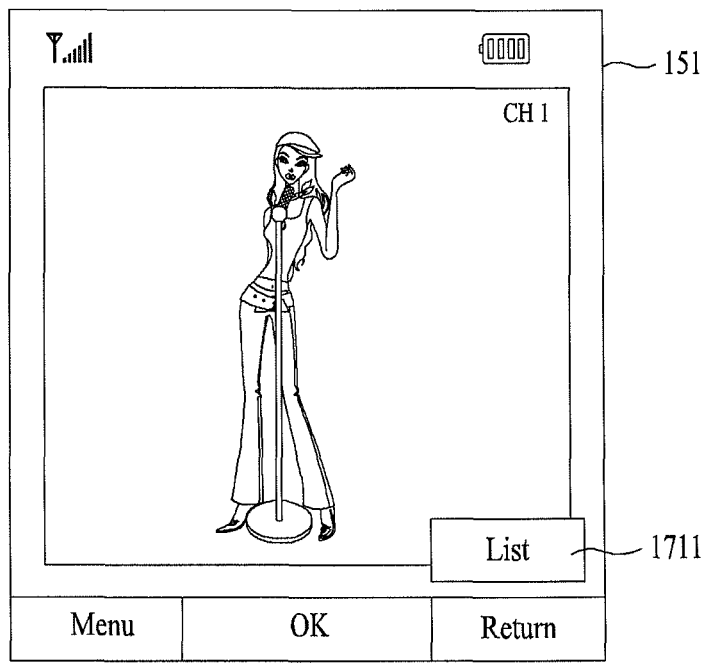
Figure 18A:
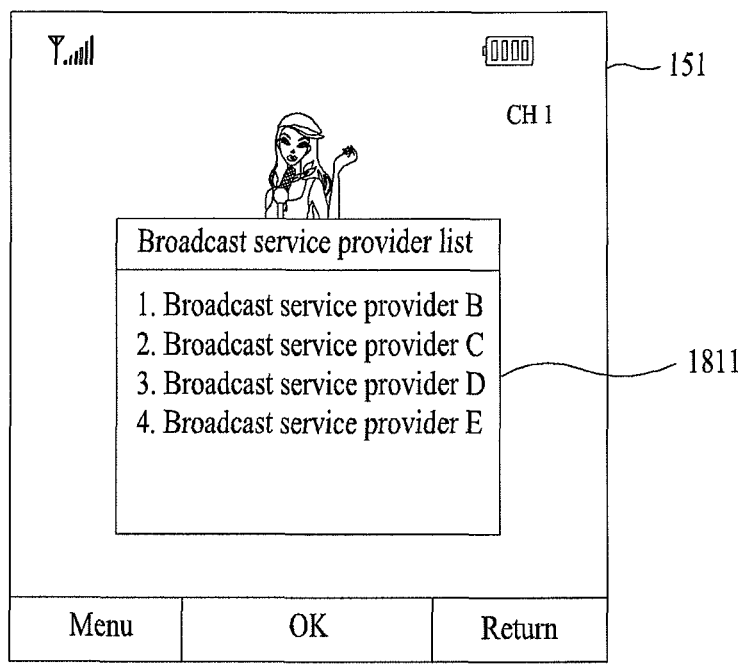

Referring to FIG. 17, according to an embodiment of the present invention, the mobile terminal 100 displays a key region list 1711 for selecting a different broadcast service provider on a prescribed portion of the display screen 151. When the displayed list 1711 is selected by a user, the mobile terminal 100 activates the list 1711 and displays a broadcast service provider list 1811 including available different broadcast service providers, as shown in FIG. 18A. When a specific broadcast service provider is selected from the broadcast service provider list 1811 via the user input unit 130, the mobile terminal 100 switches to a broadcast mode corresponding to the selected specific broadcast service provider.

Figure 18B:
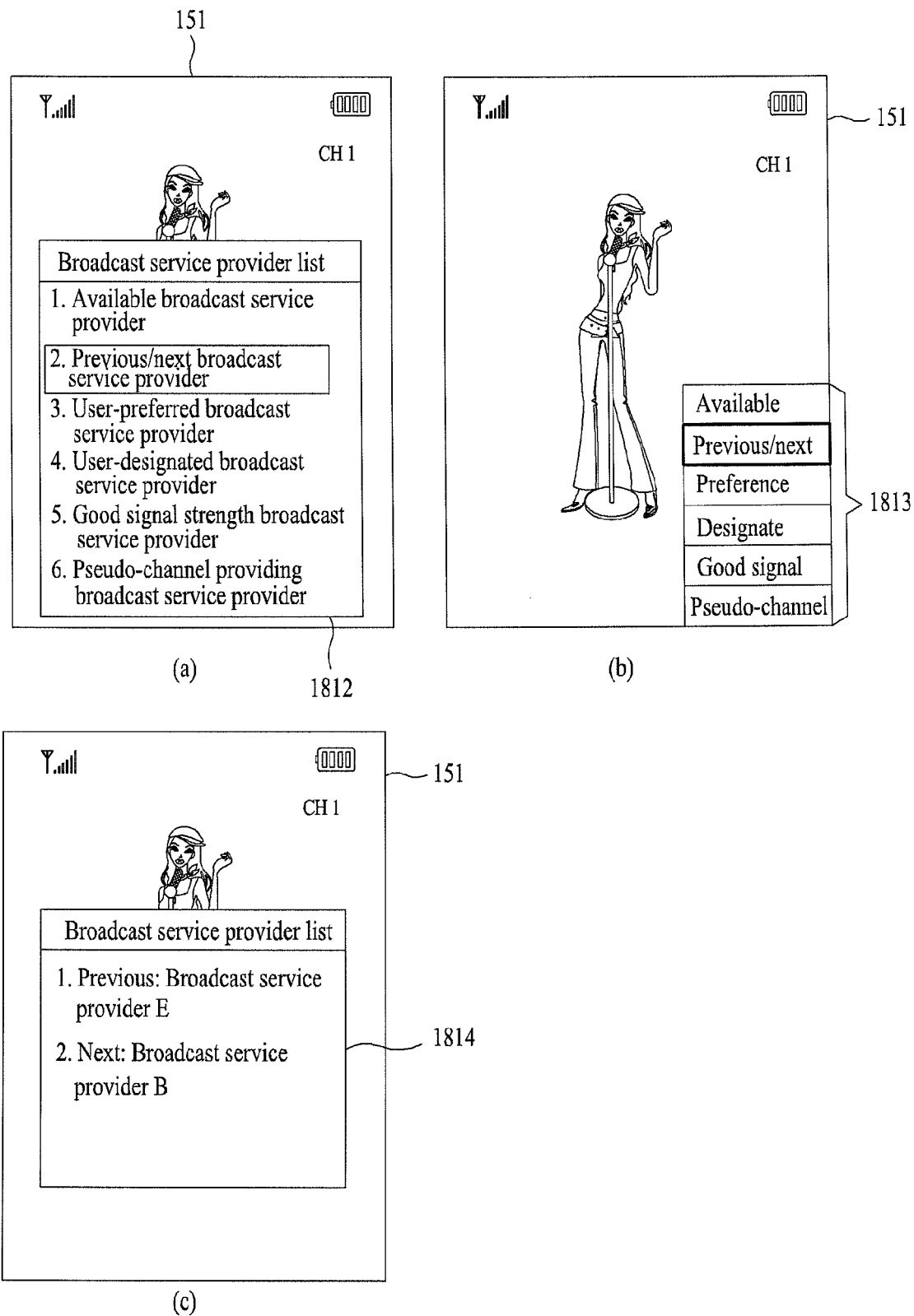

Alternatively, when the displayed list 1711 shown in FIG. 17 is selected by a user, the mobile terminal 100 activates the list 1711 and may display a broadcast service provider list 1812 assorting the broadcast service providers according to various categories, as shown in FIG. 18B(a) or a key region 1813 with assorted categories, as shown in FIG. 18B(b). For example, when "previous/next broadcast service provider" is selected in FIG. 18B(a) or "previous/next" is selected in FIG. 18B(b), the mobile terminal 100 displays a broadcast service provider list 1814 including the previous and next broadcast service providers on the display screen 151, as shown in FIG. 18B(c). Optionally, key regions corresponding to the previous and next broadcast service providers may also be displayed.

In these examples, the previous and next broadcast service providers refer to the broadcast service providers which have frequencies next or previous to a frequency assigned to a broadcast service provider corresponding to the current broadcast mode. Alternatively, the previous/next broadcast service provider may be designated based on a number assigned to a broadcast service provider or use history of broadcast service providers. If the previous or next broadcast service provider is selected from the list 1814 via the user input unit 130, the mobile terminal 100 switches from the current broadcast mode to a broadcast mode corresponding to the selected broadcast service provider.

Figure 19:
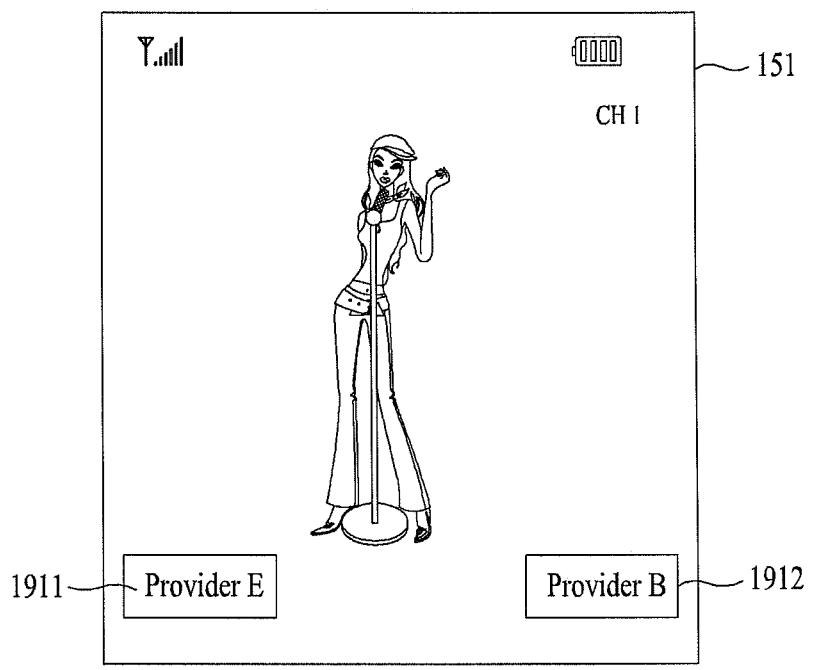
Figure 20A:
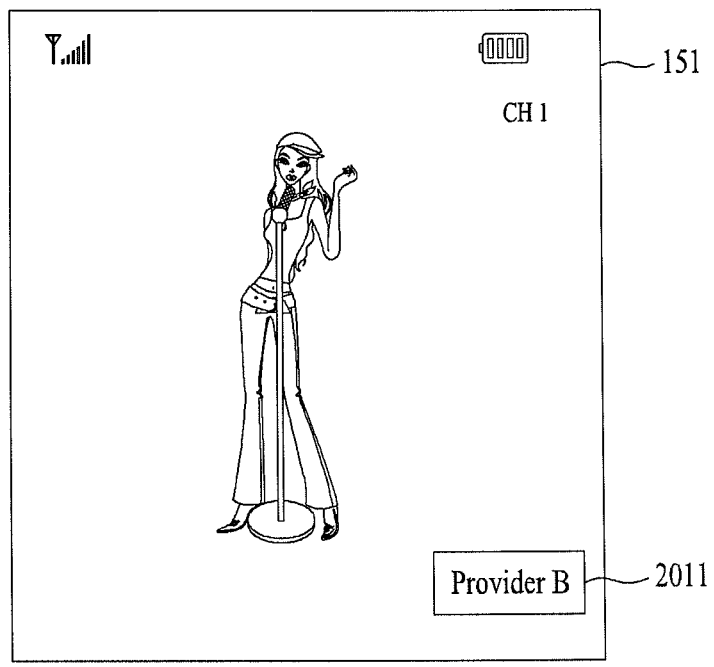
Figure 20B:
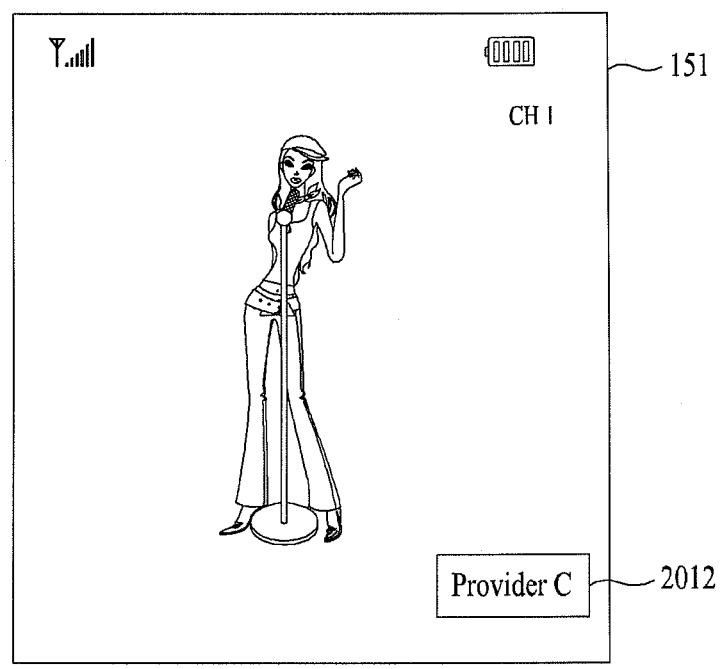
Figure 20C:
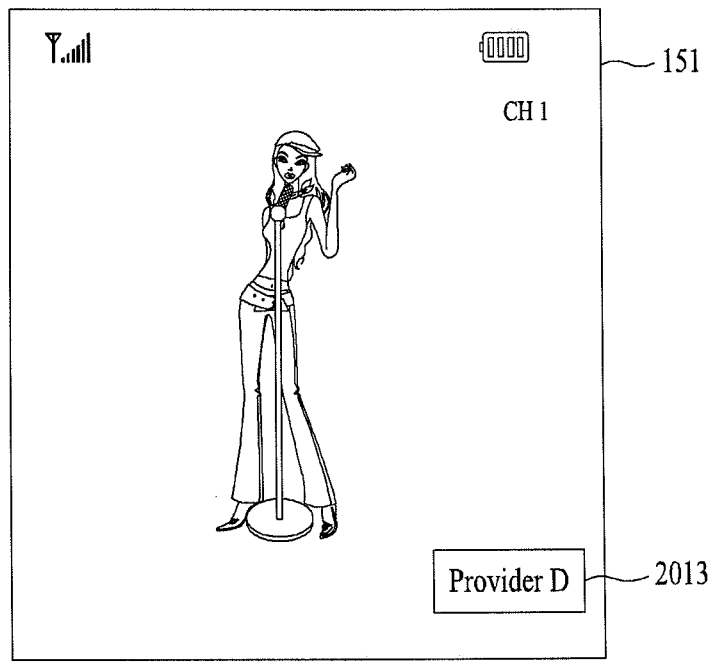
Figure 20D:
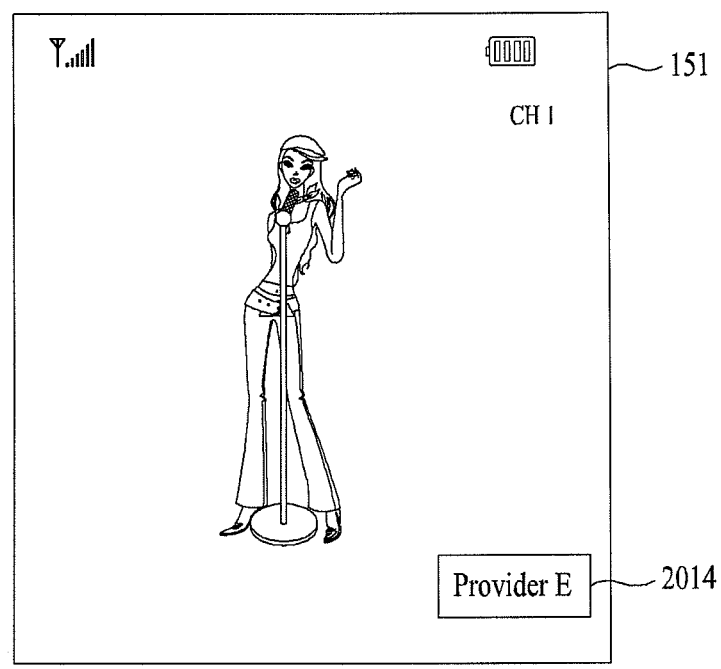

According to an embodiment of the present invention, the mobile terminal 100 displays key regions 1911 and 1912 corresponding to the previous and next broadcast service providers, respectively, as shown in FIG. 19. For example, identification information of the previous or next broadcast service provider may be displayed as a name, an icon or the like in each of the key regions. Optionally, a key region corresponding to the previous broadcast service provider or the next broadcast service provider may be displayed as well. Hence, as the key region corresponding to either the previous broadcast service provider or the next broadcast service provider is activated responsive to a user's selection received via the user input unit 130, the mobile terminal 100 switches to a broadcast mode of the broadcast service provider corresponding to the activated key region.

According to an embodiment of the present invention, the mobile terminal 100 sequentially displays key regions that correspond to a plurality of available different broadcast service providers, as shown in FIGS. 20A to 20D. For example, the display order may be determined according to an order of frequencies assigned to the broadcast service providers, a user designated order, a random order generated by the mobile terminal 100, or an order of numbers set for each broadcast service provider. Identification information of the previous or next broadcast service provider, such as a name, an icon or the like, may be displayed in each of the key regions. Hence, as one of the sequentially displayed key regions is activated responsive to a user's selection action received via the user input unit 130, the mobile terminal 100 switches to a broadcast mode of the broadcast service provider corresponding to the activated key region.

Figure 21:
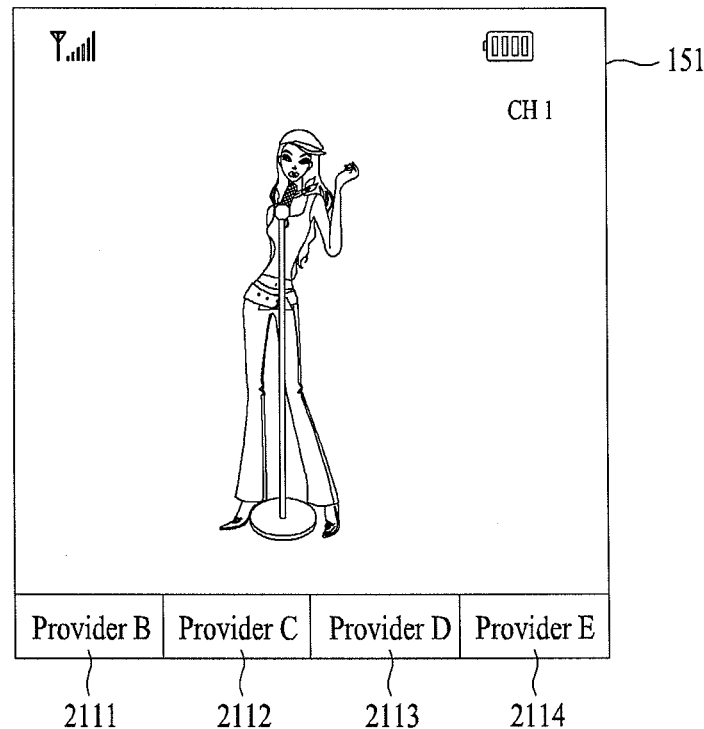

According to an embodiment of the present invention, the mobile terminal 100 displays key regions 2111, 2112, 2113 and 2114 that correspond to a plurality of available different broadcast service providers, as shown in FIG. 21. In this case, identification information of a corresponding broadcast service provider may be displayed in each of the key regions as a name, an icon or the like. Hence, as one of the displayed key regions 2111, 2112, 2113 and 2114 is activated responsive to a user's selection action received via the user input unit 130, the mobile terminal 100 switches to a broadcast mode of the broadcast service provider corresponding to the activated key region.

Figure 22A:
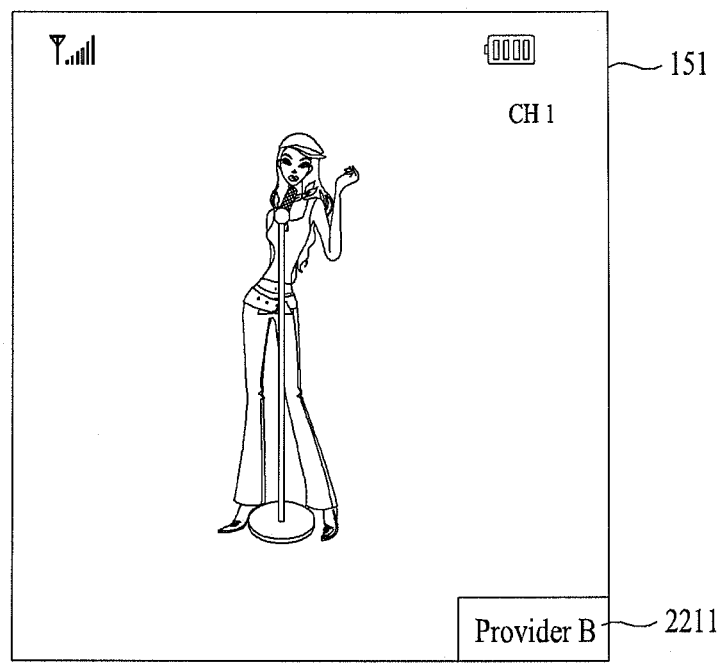
Figure 22B:
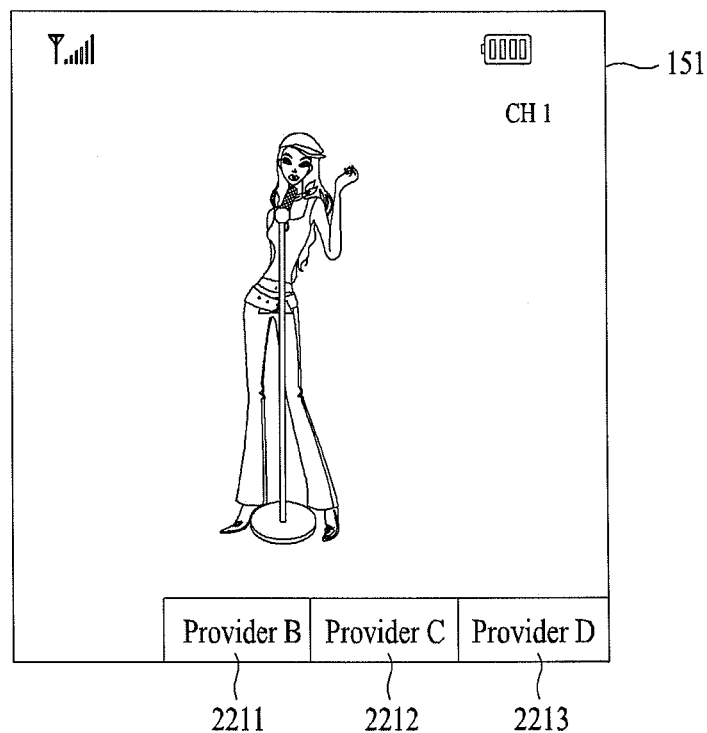
Figure 22C:
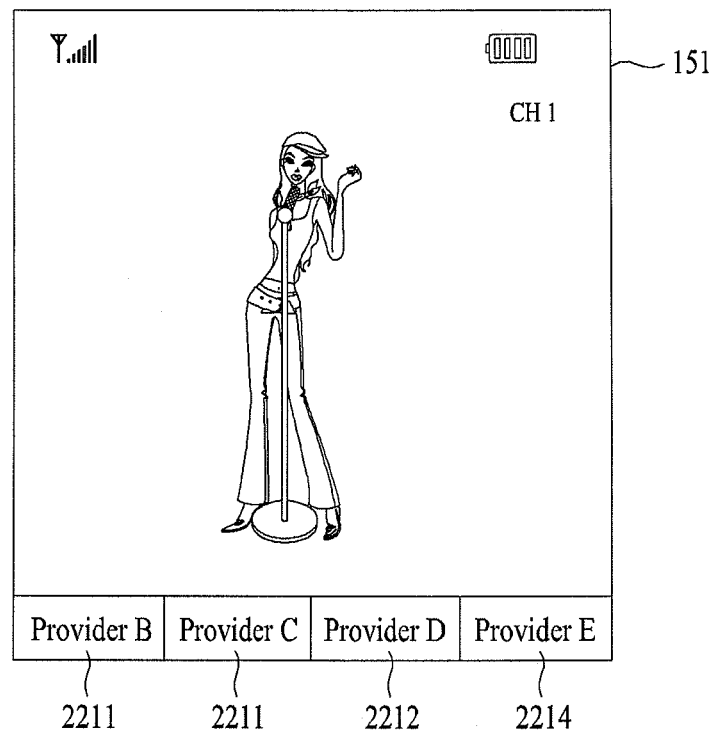

According to an embodiment of the present invention, if a specific broadcast service provider is selected before searching of available broadcast service providers is completed, the mobile terminal 100 displays at least one key region corresponding to at least one searched available different broadcast service provider in real time as the at least one broadcast service provider is searched, as shown in FIGS. 22A to 22C. If a different broadcast service provider was not available when selecting the specific broadcast service provider and when at least one different broadcast service provider becomes available after selecting the specific broadcast service provider, the terminal 100 displays a key region corresponding to the at least one different broadcast service provider. Hence, as one of the key regions 2211, 2212, 2213 and 2214 displayed in real time, as shown in FIGS. 22A to 22C, is activated responsive to a user's selection action received via the user input unit 130, the mobile terminal 100 switches to a broadcast mode of the broadcast service provider corresponding to the activated key region.

Figure 23A:
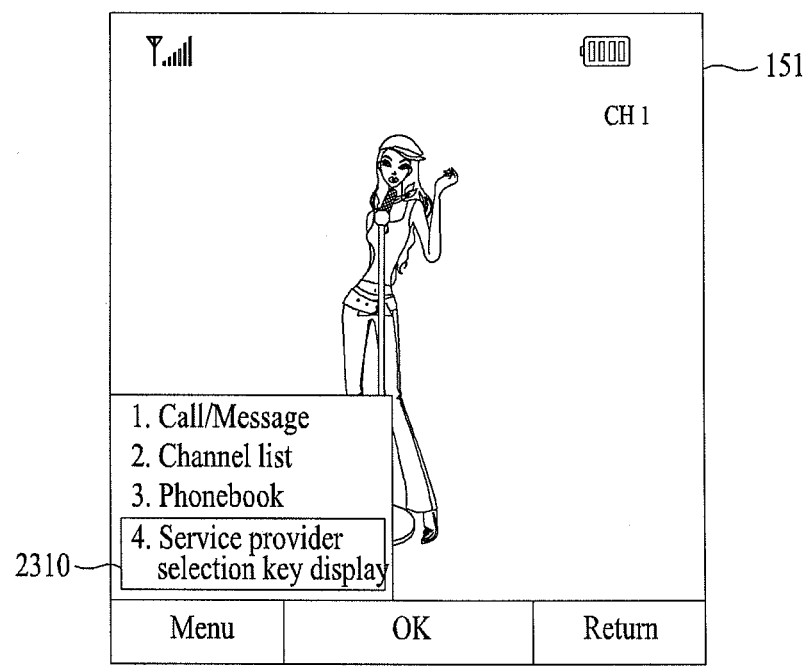
Figure 23B:
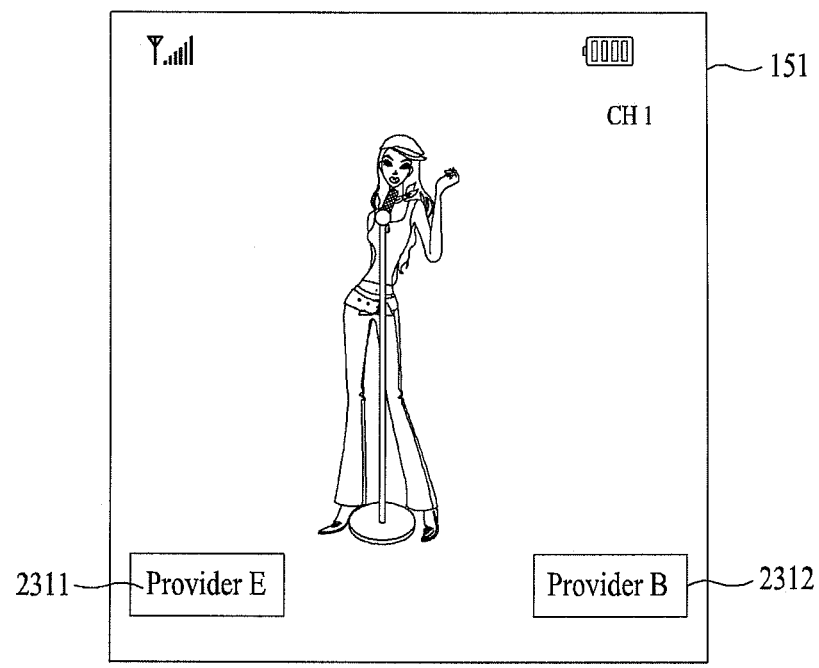

According to an embodiment of the present invention, when a menu item service provider selection key display 2310 for selecting a different broadcast service provider is selected via a menu search, as shown in FIG. 23A, the mobile terminal 100 displays key regions 2311 and 2312 corresponding to at least one or more different broadcast service providers, as shown in FIG. 23B. Hence, as one of the key regions 2311 and 2312 displayed in real time is activated responsive to a user's selection action received via the user input unit 130, the mobile terminal 100 switches to a broadcast mode of the broadcast service provider corresponding to the activated key region.

Moreover, if the first broadcast mode entered in S519 of FIG. 5 is impossible, the mobile terminal 100 rescans the frequencies assigned to broadcast service providers and performs various operations according to the result of the frequency scanning. For example, the broadcast mode execution may become impossible when a broadcast signal strength is reduced such that the signal strength is lower than a predetermined strength, or when the mobile terminal 100 enters a dead zone.

Further, the mobile terminal 100 may set a scan period or cycle that is different for each broadcast service provider. The mobile terminal 100 may set a long or short scan period for a broadcast service provider corresponding to the first broadcast mode. Even if execution of the first broadcast mode is possible, the mobile terminal 100 may scan the frequencies assigned to broadcast service providers periodically according to a user setting or randomly.

Figure 24:
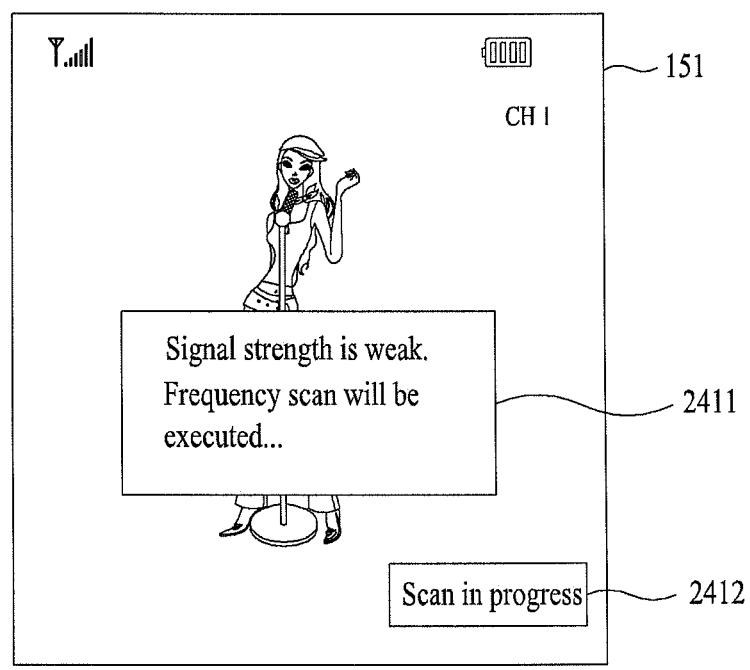
FIGS. 24 to 26C show a screen on which a process of switching to a different broadcast service provider is displayed in a mobile terminal according to an embodiment of the present invention when the current broadcast signal strength is weak.

In the following description, a case of poor reception of a broadcast signal is taken as an example in which the broadcast execution is impossible. A screen configuration according to the weak broadcast signal strength is explained with reference to FIGS. 24 to 26C. Referring to FIG. 24, when the broadcast signal strength is weak, the mobile terminal 100 indicates that the frequency scan operation will be performed due to the weak broadcast signal strength of the currently selected broadcast channel or program and performs the frequency scan operation (2411). The execution of the frequency scan operation may be indicated by an icon 2412, text, an image, a symbol and the like.

Figure 25A:
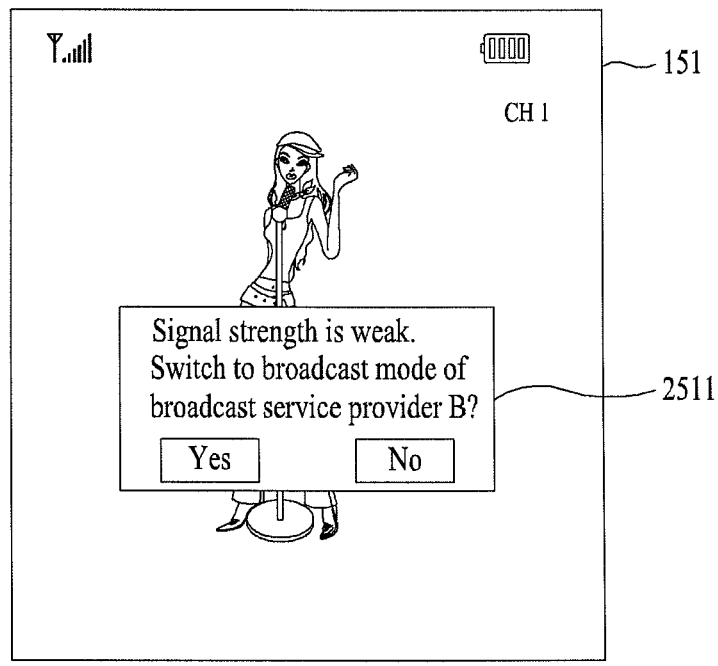
Figure 25B:
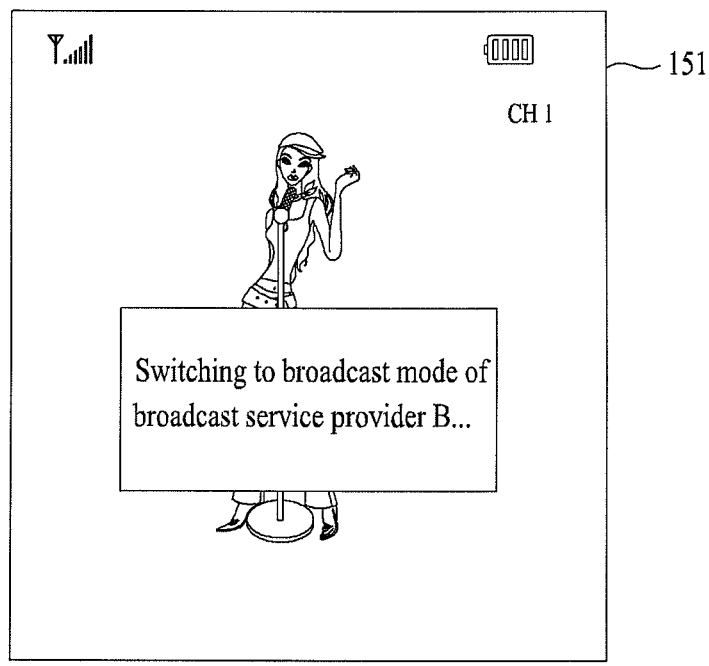

Referring to FIG. 25A, when the broadcast signal strength is weak, the mobile terminal 100 displays a window 2511 for prompting a user to select a different broadcast service provider satisfying a specific condition. Alternatively, in FIG. 25B, the mobile terminal automatically selects a different broadcast service provider satisfying a specific condition, indicating the automatic selection of the different broadcast service provider. For example, the specific condition may include strong signal strength, preference, availability of a similar channel, user designation or the like.

Figure 26A:
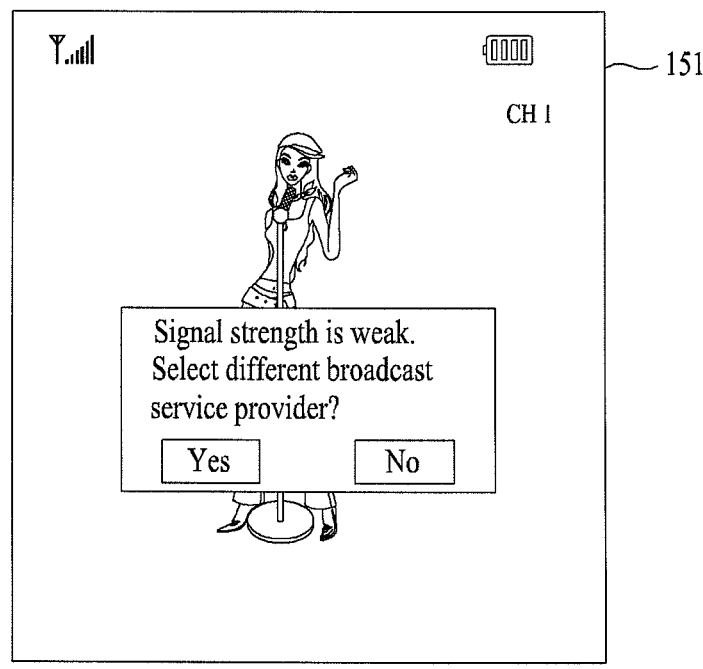
Figure 26B:
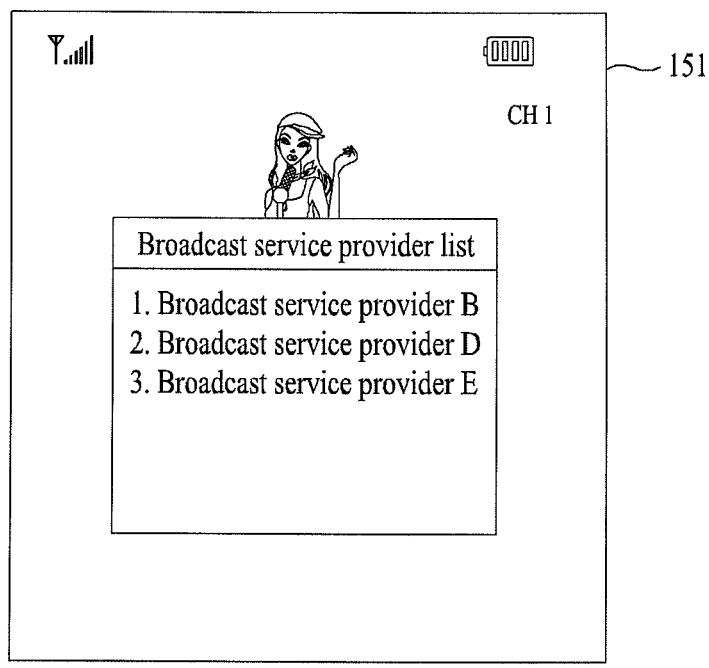
Figure 26C:
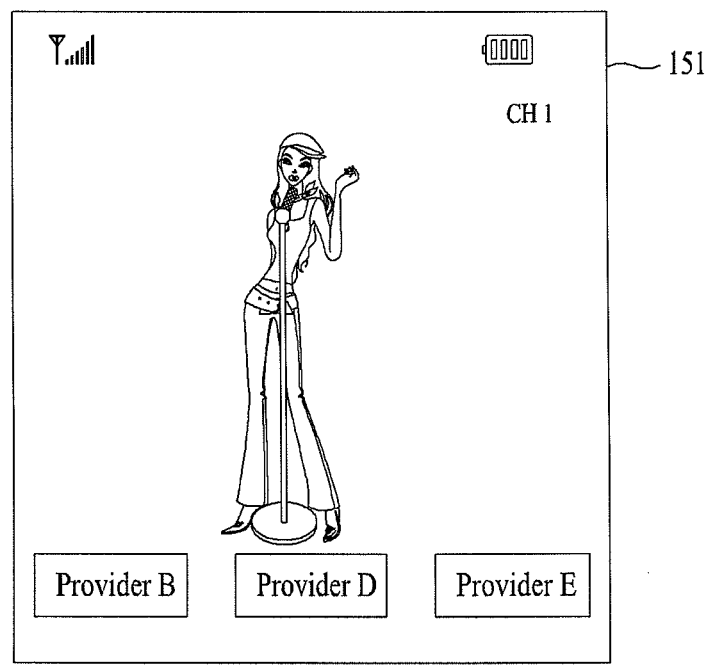

Referring to FIGS. 26A to 26C, when the broadcast signal strength is weak, the mobile terminal 100 displays a window for prompting a user to select a different broadcast service provider, as shown in FIG. 26A. If "yes" is selected in FIG. 26A, the mobile terminal 100 displays a broadcast service provider list including names of available different broadcast service providers on the display screen 151, as shown in FIG. 26B or displays a key region for selecting each of the available broadcast service providers on a prescribed portion of the display screen 151, as shown in FIG. 26C. If a specific different broadcast service provider is selected from the displayed list shown in FIG. 26B or the displayed key regions shown in FIG. 26C, the mobile terminal 100 switches to a broadcast mode corresponding to the selected specific different broadcast service provider.

When the mobile terminal 100 enters the first broadcast mode, the mobile terminal receives first broadcast guide information of a first broadcast service provider corresponding to the first broadcast mode and may store the received first broadcast guide information in the memory 160. If the first broadcast mode is switched to a second broadcast mode, the mobile terminal 100 receives second broadcast guide information and may store the received second broadcast guide information in the memory 160 without deleting the first broadcast guide information. Hence, if the first broadcast mode is re-entered later, it is not necessary to receive and store the first broadcast guide information again. Alternatively, if the first broadcast mode is switched to the second broadcast mode, the first broadcast guide information may be deleted from the memory 160.

According to one embodiment of the present invention, the above-described method of selecting a broadcast service provided in a mobile terminal can be implemented in a program recorded medium as computer-readable codes. The computer-readable media include all kinds of recording devices in which data readable by a computer system are stored. The computer-readable media include ROM, RAM, CD-ROM, magnetic tapes, floppy discs, optical data storage devices, and the like, further including carrier-wave type implementations, for example, transmission via Internet. And, the computer may include the controller 180 of the mobile terminal 100.

Accordingly, various embodiments of the present invention provide the following effects and/or advantages. A first feature includes an automatically selecting one or more of a specific broadcast service provider from at least one or more available broadcast service providers, thereby enabling a user to avoid inconveniently selecting a broadcast service provider browsing one by one from a list. A second feature includes displaying a key region for selecting a different broadcast service provider after entering a broadcast mode corresponding to a selected specific broadcast service provider, thereby facilitating easy broadcast mode switching while executing the currently entered broadcast mode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A mobile terminal comprising:
a wireless communication unit configured to search for at least one broadcast service provider based upon frequencies assigned to the at least one broadcast service provider; and
a controller configured to automatically select a first broadcast service provider after determining that the first broadcast service provider is the only available one of the at least one broadcast service provider at a current position of the mobile terminal and to output broadcast content provided by the selected first broadcast service provider,
wherein a previously designated specific broadcast service provider is selected as the first broadcast service provider when the previously designated specific broadcast service provider is the only available broadcast service provider at the current position of the mobile terminal, and
wherein a broadcast service provider that is not the previously designated specific broadcast service provider is selected as the first broadcast service provider when the previously designated specific broadcast service provider is not available at the current position of the mobile terminal.

2. The mobile terminal of claim 1, wherein the first broadcast service provider is selected even if the first broadcast service provider has not been designated as a specific broadcast service provider for selection.

3. The mobile terminal of claim 1, wherein the controller is further configured to:

automatically select a designated specific broadcast service provider as the first broadcast service provider responsive to searching the designated specific broadcast service provider during the search if the designated specific broadcast service provider is available at the current position of the mobile terminal.

4. The mobile terminal of claim 1, wherein the wireless communication unit is further configured to:
continue to search for at least one additional broadcast service provider after the first broadcast service provider is automatically selected.

5. The mobile terminal of claim 1, wherein the controller is further configured to:
automatically select the first broadcast service provider, which is not a designated specific broadcast service provider, even if the designated specific broadcast service provider is available at the current position of the mobile terminal, upon determining that any received signaling associated with the designated specific broadcast service provider has fallen below a threshold.

6. The mobile terminal of claim 5, wherein the wireless communication unit is further configured to:
search for the designated broadcast service provider after the first broadcast service provider is selected;
determine that the received signaling associated with the designated specific broadcast service provider meets the threshold and broadcast content provided by the designated broadcast service provider is available to be received by the mobile terminal; and
switch from the first broadcast service provider to the designated broadcast service provider responsive to the determining that the designated broadcast service provider is available.

7. The mobile terminal of claim 1, further comprising:
a display unit configured to display a broadcast service provider list comprising at least one available broadcast service provider when the first broadcast service provider is not the only available broadcast service provider at the current position of the mobile terminal.

8. The mobile terminal of claim 7, wherein the broadcast service provider list is categorized into defined groups, each of the defined groups comprising at least one broadcast service provider selected from the group consisting of an available broadcast service provider, a previous/next broadcast service provider, a user preferred broadcast service provider, a user designated broadcast service provider, a mobile terminal designated broadcast service provider, a strong signaling broadcast service provider, or a similar broadcasting content-providing broadcast service provider.

9. The mobile terminal of claim 1, wherein the wireless communication unit is further configured to:
receive broadcast related data corresponding to the first broadcast service provider, and wherein the mobile terminal further comprises:
an output unit configured to output the received broadcast related data, the broadcast related data comprising at least one type of data selected from the group consisting of broadcast guide information and broadcast data.

10. The mobile terminal of claim 1, wherein the wireless communication unit is further configured to:
receive identification information for identifying each of the at least one broadcast service provider to permit the controller to identify at least one available broadcast service provider among the searched at least one broadcast service provider.

11. The mobile terminal of claim 1, further comprising:
a display unit configured to display broadcasting content corresponding to the first broadcast service provider, the display unit comprising an area for receiving user input for selecting a second broadcast service provider.

12. The mobile terminal of claim 1, wherein the wireless communication unit is further configured to:
continue to search for at least one broadcast service provider when a signal strength for the broadcasting content provided by the selected first broadcast service provider falls below a threshold, wherein the mobile terminal further comprises:
a display unit configured to display a broadcast service provider list when the signal strength for the broadcasting content received from the first broadcast service provider remains below the threshold.

13. A method of selecting a broadcast service provider in a mobile terminal, the method comprising:
scanning frequencies assigned to broadcast service providers;
searching for at least one available broadcast service provider according to a result of the scanning;
automatically selecting a first broadcast service provider after determining that the first broadcast service provider is the only available broadcast service provider at a current position of the mobile terminal,
wherein a previously designated specific broadcast service provider is selected as the first broadcast service provider when the previously designated specific broadcast service provider is the only available broadcast service provider at the current position of the mobile terminal, and
wherein a broadcast service provider that is not the previously designated specific broadcast service provider is selected as the first broadcast service provider when the previously designated specific broadcast service provider is not available at the current position of the mobile terminal; and
outputting broadcast content provided by the selected first broadcast service provider.

14. The method of claim 13, wherein the first broadcast service provider is selected even if the first broadcast service provider has not been designated as a specific broadcast service provider for selection.

15. The method of claim 14, further comprising:
automatically selecting a designated specific broadcast service provider responsive to searching the designated specific broadcast service provider during the search if the designated specific broadcast service provider is available at the current position of the mobile terminal.

16. The method of claim 13, further comprising:
continuing to search for at least one additional broadcast service provider after selecting the first broadcast service provider.

17. The method of claim 13, further comprising:
continuing to search for the at least one broadcast service provider after the first broadcast service provider is selected when the first broadcast service provider is the broadcast service provider that is not the previously designated specific broadcast service provider.

18. The method of claim 17, further comprising:
automatically selecting the previously designated specific broadcast service provider when the previously designated specific broadcast service provider becomes available while outputting the broadcast content provided by the selected first broadcast service provider that is not the previously designated specific broadcast service provider.

19. The method of claim 17, further comprising:
prompting whether to select the previously designated specific broadcast service provider when the previously designated specific broadcast service provider becomes available while outputting the broadcasting content provided by the selected first broadcast service provider that is not the previously designated specific broadcast service provider.

20. The method of claim 13, further comprising:
selecting a second broadcast service provider while outputting the broadcast content provided by the selected first broadcast service provider.

21. The method of claim 20, further comprising:
displaying the second broadcast service provider at a key region of a display of the mobile terminal when the second broadcast service provider becomes available while outputting the broadcast content provided by the selected first broadcast service provider, the key region permitting the second broadcast service provider to be selected by a user.

22. The method of claim 20, further comprising:
displaying a broadcast service provider list when at least one broadcast service provider other than the selected first broadcast service provider becomes available; and
selecting the second broadcast service provider from the broadcast service provider list comprising the at least one available broadcast service provider other than the first broadcast service provider.

23. The method of claim 20, further comprising:
automatically outputting broadcast content provided by the selected second broadcast service provider when only one broadcasting content is available from the second broadcast service provider.

24. The method of claim 20, further comprising:
displaying a broadcast program list comprising at least one available broadcast content provided by the selected second broadcast service provider;
selecting a broadcast program from the list responsive to input received via an input unit of the mobile terminal; and
outputting broadcasting content corresponding to the selected broadcast program provided by the selected second broadcast service provider.

* * * * *